United States Patent [19]
Hawkins et al.

[11] Patent Number: 5,381,150
[45] Date of Patent: Jan. 10, 1995

[54] PARTIAL INTERCEPT LPI (LOW PROBABILITY OF INTERCEPT) RECONNAISSANCE SYSTEM

[75] Inventors: Christopher A. Hawkins, Fremont; Fred M. Tse, Cupertino, both of Calif.

[73] Assignee: TRW Inc., Redondo Beach, Calif.

[21] Appl. No.: 58,652

[22] Filed: May 7, 1993

[51] Int. Cl.$^6$ .......................... G01S 7/36; G01S 7/42
[52] U.S. Cl. ........................................ 342/13; 342/192
[58] Field of Search ................... 342/13, 20, 192, 195

[56] References Cited

U.S. PATENT DOCUMENTS

| | | | |
|---|---|---|---|
| 3,876,946 | 4/1975 | La Clair et al. | 324/77 CS X |
| 4,146,892 | 3/1979 | Overman et al. | 342/192 X |
| 4,217,580 | 8/1980 | Lowenschuss | 342/192 X |
| 4,918,455 | 4/1990 | Maier | 342/13 |
| 4,958,361 | 9/1990 | Rosen et al. | 375/102 |
| 5,063,385 | 11/1991 | Caschera | 342/13 |
| 5,184,138 | 2/1993 | Terry et al. | 342/195 |

Primary Examiner—Gilberto Barrón, Jr.
Attorney, Agent, or Firm—G. Gregory Schivley; Robert W. Keller

[57] ABSTRACT

Disclosed is an apparatus and method for separately tracking, identifying and providing DF on LPI RF transmitters. Intercepter circuitry which includes an antenna and a single channel receiver is utilized to receive and down convert LPI RF signals to LPI IF signals. Digitizer circuitry is utilized for down converting the LPI IF signals to LPI baseband signals as well as utilized for converting the LPI baseband signals to digital data. A spectrum analyzer generates power spectrums utilizing the digital data and passes the power spectrums to a signal detector. The signal detector detects signal clusters in the power spectrums and associates the signal clusters from the same LPI RF signals to create pulse descriptor words for the LPI RF signals. Tracker/database circuitry tracks and identifies the LPI RF transmitters by utilizing the pulse duration, pulse frequency and pulse phase of the pulse descriptor words and a DF system provides DF information on the LPI RF transmitters by performing multiple frequency AOA calculations.

43 Claims, 8 Drawing Sheets

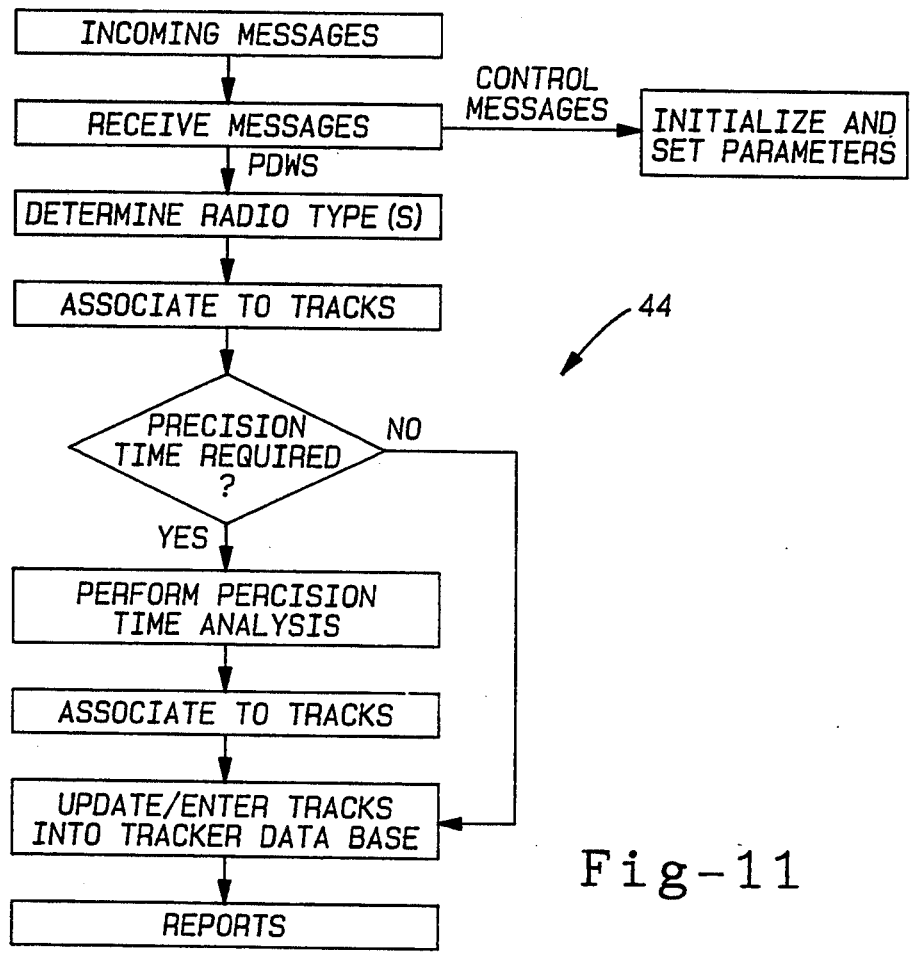
Fig-11
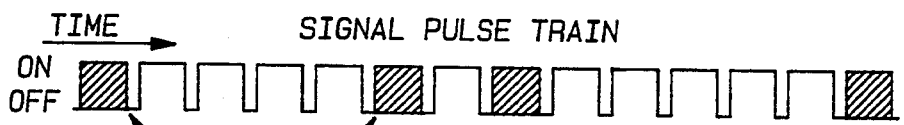
- TAKE ADVANTAGE OF THE REGULAR TIMING OF THE PULSE TRAIN
- CORRELATE THE MEASURED TIME OF DEPARTURE OF A PULSE TO THE EXPECTED TIME
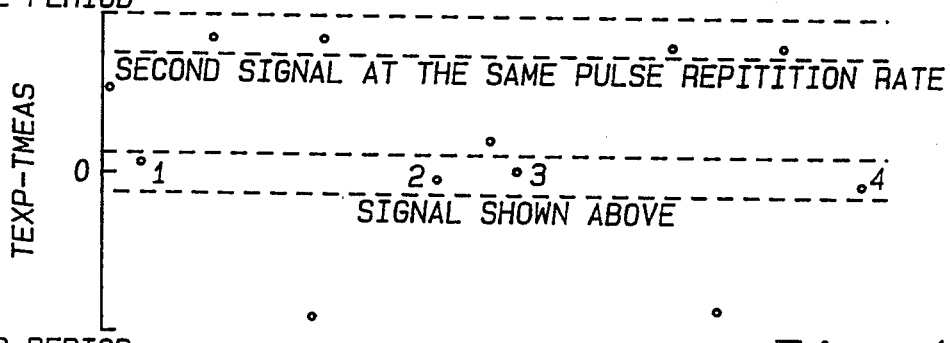
Fig-12

CASE 1: DIRECT AND REVERSE MEASUREMENTS DONE BACK TO BACK

CASE 2: ALL BASELINES DONE IN ONE DIRECTION BEFORE DOING THEM IN THE REVERSE DIRECTION

PARTIAL INTERCEPT LPI (LOW PROBABILITY OF INTERCEPT) RECONNAISSANCE SYSTEM

BACKGROUND OF THE INVENTION

1. Field of the Invention

This invention relates generally to a reconnaissance system and, more particularly, to a partial intercept LPI reconnaissance system to separately identify, track and provide DF (direction finding) on LPI RF (radio frequency) transmitters.

2. Discussion of the Related Art

Various reconnaissance systems are in use today for identifying, tracking and recording constant frequency RF signals from constant frequency RF transmitters. Some of these reconnaissance systems further provide DF capabilities for determining the location of the RF transmitters based upon the AOA (angle of arrival) of the RF signals. The AOA is typically calculated by utilizing relative phase measurements at a constant RF frequency gathered from multiple antenna pairs, known as baselines, in an antenna array. Once a set of baseline measurements from the antenna pairs have been gathered, the AOA calculation is made by utilizing a calibration table to determine RF transmitter locations.

In addition to tracking, recording, identifying and providing DF on constant frequency RF transmitters, there is a growing need to identify, track and provide DF on LPI RF transmitters. These LPI RF transmitters utilize frequency agile techniques which makes them difficult to intercept and, thus, difficult to identify, track and provide DF. The frequency agile radios randomly change their carrier frequency over a very wide bandwidth while they are transmitting at a fixed timing sequence. Thus, most reconnaissance systems in use today, including DF systems, cannot identify, track and provide DF on the LPI RF transmitters because the LPI RF signal disappears before the reconnaissance systems can gather a set of baseline measurements. However, there have been some reconnaissance systems designed to attack the problem of frequency agile LPI RF transmitters. These systems include a full band approach reconnaissance system, a pulse rate detector reconnaissance system and a narrow band fast scan DF reconnaissance system.

The full band approach reconnaissance system is a high end system which utilizes a wideband receiver (or a bank of wideband receivers) that covers the full LPI bandwidth, thus ensuring the intercept of a large percentage of the LPI RF signal pulses (e.g. 50% or more). The full band approach relies on intercepting this large percentage of the LPI RF signal pulses to identify the LPI RF transmitters. Some full band approach reconnaissance systems also include a monopulse DF capability to determine the location of the LPI RF transmitters. The DF or AOA in this type of system is calculated by utilizing a single frequency algorithm. Most of the high end full band approach reconnaissance systems provide tracking of the LPI RF transmitters, LPI RF transmitter type identification, copying of the LPI RF signal, and DF on all LPI RF transmitters. However, the full band approach reconnaissance system has several drawbacks associated with its use which include cost, weight, size and power consumption.

The pulse rate detector reconnaissance system is a low end system which is able to detect the presence of LPI RF transmitters and identify the LPI RF transmitter type. The pulse rate detector reconnaissance system essentially takes a sample of LPI RF signals over the LPI RF transmitter bandwidth and runs a spectral analysis to determine the pulse rate of the LPI RF transmitters. However, one drawback of this system is that if several LPI RF transmitters are transmitting simultaneously at the same pulse rate, this system cannot distinguish between the various LPI RF transmitters. Another drawback the pulse rate detector reconnaissance system suffers from is that it does not contain DF capabilities to determine the location of LPI RF transmitters.

The narrowband fast scan DF reconnaissance system utilizes a narrowband receiver (i.e., 50 KHz) that is stepped in frequency very quickly to capture LPI RF signals. When a LPI RF signal is detected, a fast DF is taken to determine AOA at that particular frequency. This result is then plotted on a screen which displays the frequency versus AOA. As more LPI RF signals are detected at different frequencies and plotted, a line will appear on the screen having the same AOA at various frequencies. This allows the operator to determine the location of the LPI RF transmitter based upon the AOA. However, since the system is not capturing the rising or falling edge of the LPI RF signals, the system cannot provide LPI RF transmitter type identification or separately track multiple LPI RF transmitters.

Each of the current reconnaissance systems are designed to address the problems associated with frequency angle LPI RF transmitters and are capable of providing various information such as tracking, copying, identification and DF information. However, each of these reconnaissance systems have several drawbacks associated with their use that effect their cost, weight, size, power consumption and inability to provide certain functions. What is needed then is a partial intercept LPI reconnaissance system which is capable of providing: identification of LPI RF transmitter types; separate tracking of LPI RF transmitters; and DF on all LPI RF transmitters without suffering from the above-mentioned drawbacks. It is therefore an object of the present invention to provide such a device.

SUMMARY OF THE INVENTION

In accordance with the present invention, a partial intercept LPI reconnaissance system is utilized to separately identify, track and provide DF on LPI RF transmitters. This is basically achieved by intercepting LPI RF signals, frequency down converting the LPI RF signals and digitizing the resultant signals to digital data. This essentially allows the digital data to be utilized to generate power spectrums. Signal clusters detected in the power spectrums from the same LPI RF signals are associated to form pulse descriptor words. The LPI RF transmitters are identified by utilizing the pulse duration and pulse frequency of the pulse descriptor words (PDW) and are tracked by utilizing the pulse phase of the pulse descriptor words. The DF is provided on the LPI RF transmitters by determining the angle of arrival (AOA) of the LPI RF signals utilizing multiple frequency phase data and a calibration table.

In one preferred embodiment, intercepter circuitry intercepts a small fraction of the LPI RF signals and frequency down converts the LPI RF signals to an intermediate frequency (IF). Digitizer circuitry then down converts the IF signals to baseband signals and digitizes the baseband signals into digital data using an analog to digital converter. A spectrum analyzer generates power spectrums utilizing the digital data and a signal detector detects signal clusters in the power spectrums. The signal detector also associates signal clusters from the same LPI RF signals and creates a pulse descriptor word from the LPI RF signals.

The LPI RF transmitters are identified by utilizing the pulse duration and the pulse frequency of the pulse descriptor words in a tracker/database. The tracker/database also tracks the LPI RF transmitters by utilizing the pulse phase of the pulse descriptor words. A DF system provides DF on the LPI RF transmitters by determining the angle of arrival (AOA) of the LPI RF signals utilizing multiple frequency phase data.

Use of the present invention results in identifying, tracking and providing DF on LPI RF transmitters by employing a partial intercept LPI reconnaissance system. As a result, the aforementioned problems associated with the current approaches have been substantially eliminated.

BRIEF DESCRIPTION OF THE DRAWINGS

Still other advantages of the present invention will become apparent to those skilled in the art after reading the following specification and by reference to the drawings in which:

FIG. 11 is a block/flow diagram of the operations of a tracker/database of the present invention;

FIG. 12 is a display of the pulse timing characteristics of an LPI RF transmitter;

DETAILED DESCRIPTION OF THE PREFERRED EMBODIMENT

The following description of the preferred embodiment concerning a partial intercept LPI reconnaissance system is merely exemplary in nature and is in no way intended to limit the invention or its application of uses. Moreover, the present invention is described in detail below with reference to utilizing a narrowband DF system, however, it will be appreciated by those skilled in the art that the present invention, as defined by the appended claims, is clearly not limited to utilizing this particular type of DF system or any DF system at all.

Figure 1:
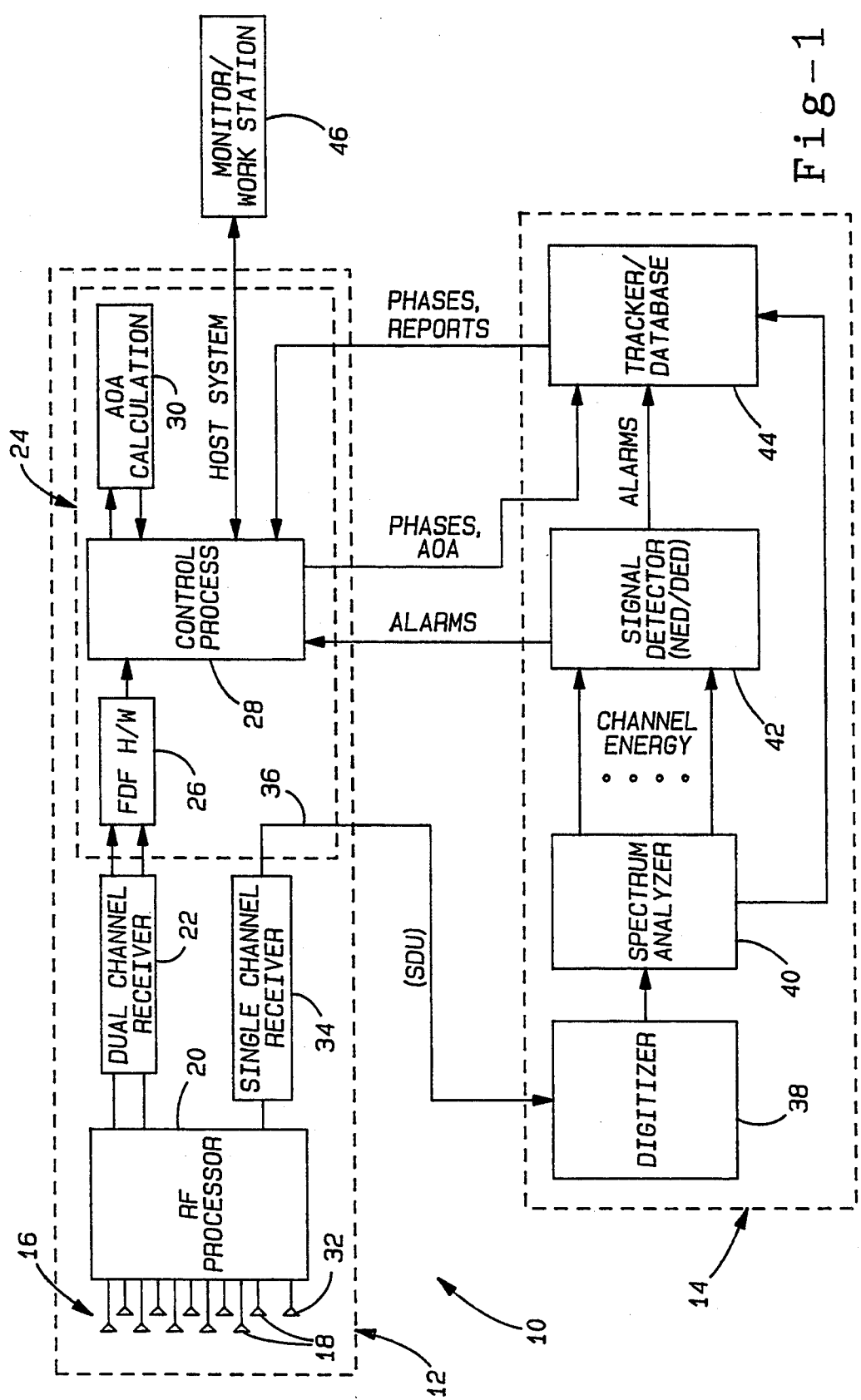
FIG. 1 is a block diagram of one preferred embodiment of the present invention.

Referring to FIG. 1, a block diagram of one preferred embodiment of a partial intercept LPI reconnaissance system 10 to separately identify, track and provide DF on LPI RF transmitters, is shown. The partial intercept LPI reconnaissance system 10 includes a narrowband DF system 12 and a partial intercept (PARINT) system 14. The narrowband DF system 12 is preferably an ESL model T/FDF. However, one skilled in the art would readily recognize that the partial intercept LPI reconnaissance system 10 could also utilize various other DF systems. For example, the partial intercept LPI reconnaissance system 10 could utilize a wideband two channel DF system or a wideband N-channel DF system.

The DF system 12 receives LPI RF signals through an antenna array 16 operating at a given frequency band such as VHF (very high frequency) or UHF (ultra high frequency). The antenna array 16 contains multiple antenna pairs 18, also known as baselines 18, which are used for determining the phase delay of the LPI RF signals received at each antenna in the antenna pairs 18. Each antenna pair 18 is switched to by utilizing an RF processor 20 which is essentially an RF switch. The LPI RF signals received by the antenna pairs 18 are applied to a dual channel receiver 22. The dual channel receiver 22 narrowband filters the LPI RF signals received by the antenna pairs 18 and down converts them into IF (intermediate frequency) signals.

The IF signals are then applied to a digital processing unit 24. The digital processing unit 24 includes FDF (fast DF) hardware 26 and a control processor 28 which performs AOA calculations 30. The FDF hardware 26 filters the IF signals and converts the IF signals to digital signals utilizing analog to digital converters. The FDF hardware 26 then integrates the digital signals to determine what is known as the cross-correlation between the antennas in the antenna pairs 18. As the RF processor 20 switches to various antenna pairs 18, the FDF hardware 26 accumulates a set of integrated cross correlation values. The control processor 28 converts the set of integrated cross correlation values into relative phase data between each antenna in the antenna pairs 18. The relative phase between each antenna pair 18 is utilized along with a calibration table to do the AOA calculation 30.

The RF processor 20 also switches a single antenna 32 to a single channel receiver 34, also known as an intercept receiver 34. The single channel receiver 34 down converts the LPI RF signal received by the antenna 32 to an IF signal which is supplied to a wideband output 36 of the single channel receiver 34. This wideband output 36, also known as a spectrum display unit output (SDU) is preferably 4 MHz wide and essentially applies the wideband IF signal which has not been narrowband filtered to a digitizer 38 in the PARINT system 14. The digitizer 38 includes a band pass filter which band filters the IF signal, preferably to 2 MHz wide. The digitizer 38 then down converts the filtered IF signal to a baseband signal and converts the baseband signal from an analog signal to a digital signal utilizing an analog to digital converter.

The digitizer 38 then applies the digital signal to a spectrum analyzer 40. The spectrum analyzer 40 stores all the digital signal data and takes power spectrum snapshots preferably every 350 microseconds from the incoming digital signal data. Of the 350 microseconds of digital signal data accumulated between each power spectrum snapshot, only approximately 50 microseconds of digital signal data is utilized to produce the power spectrum while the other 300 microseconds of data is held in memory for approximately 100 milliseconds before it is overwritten by new incoming digital signal data.

The power spectrums, also known as channel energy, are applied to a signal detector 42. The signal detector 42, also known as a NED/DED (new energy detect/down energy detect) detects rising edges and falling edges of narrowband LPI RF signals in the 2 MHz wide power spectrum. When the signal detector 42 detects a rising edge of a narrowband LPI RF signal at a desired frequency, the signal detector 42 sends an up alarm to the control processor 28. This up alarm notifies the DF system 12 to quickly tune to the desired frequency in order to gather baseline 18 measurements from the antenna array 16. Since the LPI RF signal is not constant, the DF system 12 typically gathers only a few baseline 18 measurements at that particular frequency. The control processor 28 then passes the phase data from these baseline 18 measurements to a tracker/database 44. The tracker/database 44 then accumulates a list of phase data for the various LPI RF signals tracked and returns the phase data in a report to the control processor 28. The control processor 28 then uses this accumulated phase data to do an accurate AOA calculation 30 by utilizing a multiple frequency algorithm.

As the signal detector 42 detects a falling edge of a narrowband LPI RF signal in the power spectrum, the signal detector 42 sends a down alarm to the tracker/database 44. Once the tracker/database 44 detects the down alarm, it gathers data about that LPI RF signal, such as when the LPI RF signal went up and down, what frequency the LPI RF signal was at and what was the strength of the LPI RF signal. This data is called a PDW (pulse descriptor word). It should also be noted that if an up alarm is sent to the control processor 28 and a DF is requested for that up alarm, the down alarm for that particular signal is held until the phase information from the DF system 12 returns so that all the information regarding that particular LPI RF signal is combined in the tracker/database 44. The tracker/database 44 then attempts to associate each PDW with a currently transmitting LPI RF transmitter in an official database or places it in a candidate database for association with later gathered PDWs. As the PDWs are gathered and associated in the official database or the candidate database, the tracker/database 44 can separately track the various LPI RF transmitters and identify the various LPI RF transmitter types currently transmitting. This tracking and identification data is then reported to the control processor 28. The control processor 28 then transfers the reports containing the tracking, identification and DF of the LPI RF transmitters to a monitor/workstation 46. This enables an operator (not shown) using the monitor/workstation 46 to utilize the gathered information.

Figure 2:
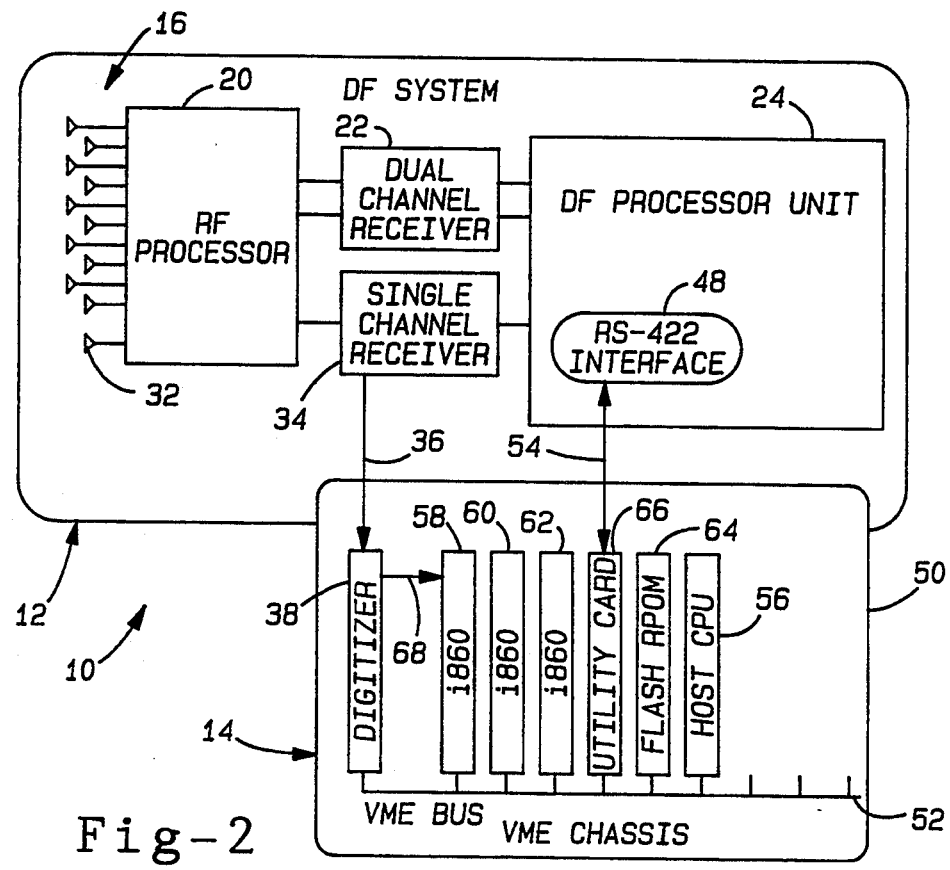
FIG. 2 is a chassis diagram of the present invention.

Turning to FIG. 2, the partial intercept LPI reconnaissance system 10 is shown constructed. The partial intercept LPI reconnaissance system 10 includes both the DF system 12 and the PARINT system 14. The DF system 12 consists of the antenna array 16, the RF processor 20, the dual channel receiver 22, the single channel receiver 34, and the digital processor unit 24. The digital processor unit 24 includes the FDF hardware 26, the control processor 28 and a serial interface I/O card 48. The PARINT system 14 is housed in a standard 6U VME chassis 50 having a standard 32 bit VME bus 52 which operates at 10 MHz. The PARINT system 14 communicates to the DF system 12 over a communication link 54. This link is a RS-422 serial interface to the DF system 12, which operates at 1M bit/second and utilizes the same handshake protocols that are currently used between the digital processor unit 24, the dual channel receiver 22, and the RF processor 20. All the circuit card assemblies (CCAs) required for the PARINT system 14 processing are in the VME chassis 50. This approach avoids the cumbersome (and costly) requirements to retrofit custom CCAs so they can be installed in the DF system 12.

The PARINT system 14 embodied in the chassis 50 has seven CCAs in it, five of which are commercial cards. The commercial cards are a host CPU card 56, three i860 cards 58, 60 and 62, and a flash PROM card 64. The i860 card 58 also has a commercial I/O daughtercard (not shown) attached. The custom cards are the digitizer 38 and a utility card 66. Each card will be described in more detail below.

The i860 cards 58, 60 and 62 are commercially available, high performance 6U VME processor cards that handle the intense computational tasks of the PARINT system 14. Through RISC (reduced instruction set computing) and super-scalar design techniques, these processor cards have a peak performance of 40 MIPS or 80 MFLOPS. The PARINT system 14 preferably utilizes MC860-VB boards developed and sold by Mercury Computer Systems, Inc.

The first i860 card 58 which contains the spectrum analyzer 40 requires an I/O port 68 in order to receive the digital data coming from the digitizer 38. The i860 card 58 provides a 16 bit parallel TTL interface. The digitizer 38 matches this TTL interface. The I/O daughterboard is preferably model number I/OMAX-2. The I/O daughterboard also provides input FIFO (first in first out) buffers and a DMA (Direct Memory Access) controller that puts the digital data directly into the i860 processor's local memory. This I/O daughtercard fits directly onto a connector on the i860 card 58, and does not require an additional VME slot.

A commercial 6U VME processor card 56 acts as the VME host. The host CPU card 56 boots and initializes the other processor cards in the VME chassis 50, and performs control and communication functions. The PARINT system 14 preferably uses a host CPU card 56 from Force Computers, model CPU-40B/8-02, which has 8M Bytes of RAM memory.

The flash PROM card 64 is a commercial card with 8M Bytes of memory. Its purpose is to store the software executables. It should be noted that it is not required if the software can be loaded down from a disk drive (magnetic storage) that is either connected to the host CPU card 56 or that is attached to a file server on an Ethernet link (not shown). The PARINT system 14 preferably uses a flash PROM card 64 from AiTech, model C203.

Figure 3:
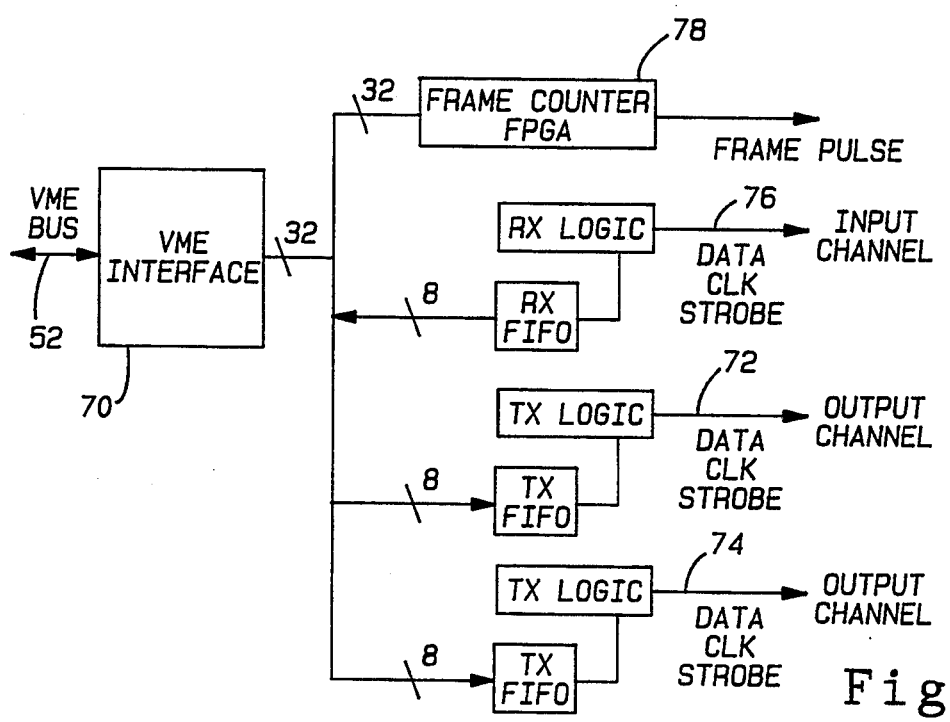
FIG. 3 is a block diagram of a utility card of the present invention.

The utility card 66 has both the PARINT system 14 serial interfaces and frame/sample counters. This board, as shown in FIG. 3, has a simple slave VME interface 70. The communication section of the utility card 66 will support three channels: two output-only channels 72 and 74 and one input channel 76. All channels have programmable speeds, which are 8, 4, 2, 1, 0.5, 0.25 and 0.06225M bits per second. The serial interface matches that of the serial interface I/O card 48 in the DF system 12. The utility card 66 also provides a frame counter 78, which is used to synchronize the digitized data stream with a real-time sample (A/D) clock (not shown). The frame counter 78 outputs a framing bit and increments its frame count every N samples, where N is programmable over the VME bus 52. The framing bit is then inserted in an unused bit location in the digitized data stream and the frame count register is read by the i860 card 58 containing the spectral analyzer 40 via the VME bus 52. The number of frames is counted by the frame counter 78, and is read over the VME bus 52. The frame counter 78 value is the central system clock used by all processors in the partial intercept LPI reconnaissance system 10.

Figure 4:
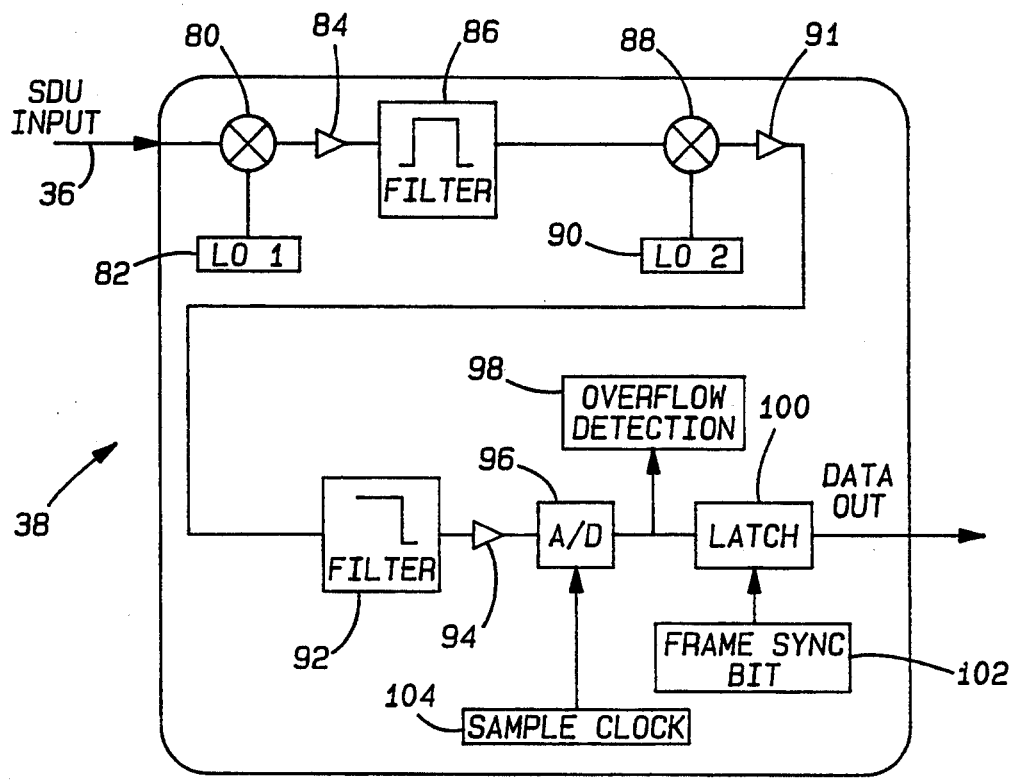
FIG. 4 is a block diagram of a digitizer card of the present invention.

The digitizer card 38, shown clearly in FIG. 4, converts the IF signal data from the single channel receiver 34 to digital signal data. The digitizer card 38 accepts the wideband IF signal from the wideband SDU output 36 in the single channel receiver 34 and applies it to a mixer 80 having a local oscillator 82. The mixer 80 up converts the wideband IF signal from approximately 21.4 MHz to 70 MHz. This signal is then amplified in an amplifier 84 and filtered preferably through a 2 MHz bandpass filter 86. The filtered signal is then down converted to a baseband signal in a mixer 88 utilizing a local oscillator 90. The local oscillators 82 and 90 are preferably temperature compensated crystal oscillators. This baseband signal is then amplified by amplifier 91 and applied to a low pass filter 92 which filters out the image signal and applies the filtered baseband signal to an amplifier 94. The amplified baseband signal is then converted to a digital signal in a 14-bit A/D converter 96. A conventional overflow detection circuit 98 monitors any overflow of digital data and a latch 100 latches the overflow if one occurs. A frame sync bit 102 is provided by the frame counter 78 in the utility card 66 and a sample clock 104 is preferably provided by an internal clock (not shown) or by the utility card 66.

The spectrum analyzer 40 in the i860 card 58 is responsible for the real-time generation of the power spectrums from the digital signal data coming from the single channel receiver 34 and the digitizer 38. The output from the spectrum analyzer 40 to the signal detector 42 in the i860 card 60 are power spectrums at regular intervals. A secondary output is the digitized raw data for use by a precision time algorithm in the tracker/database 44.

Figure 5:
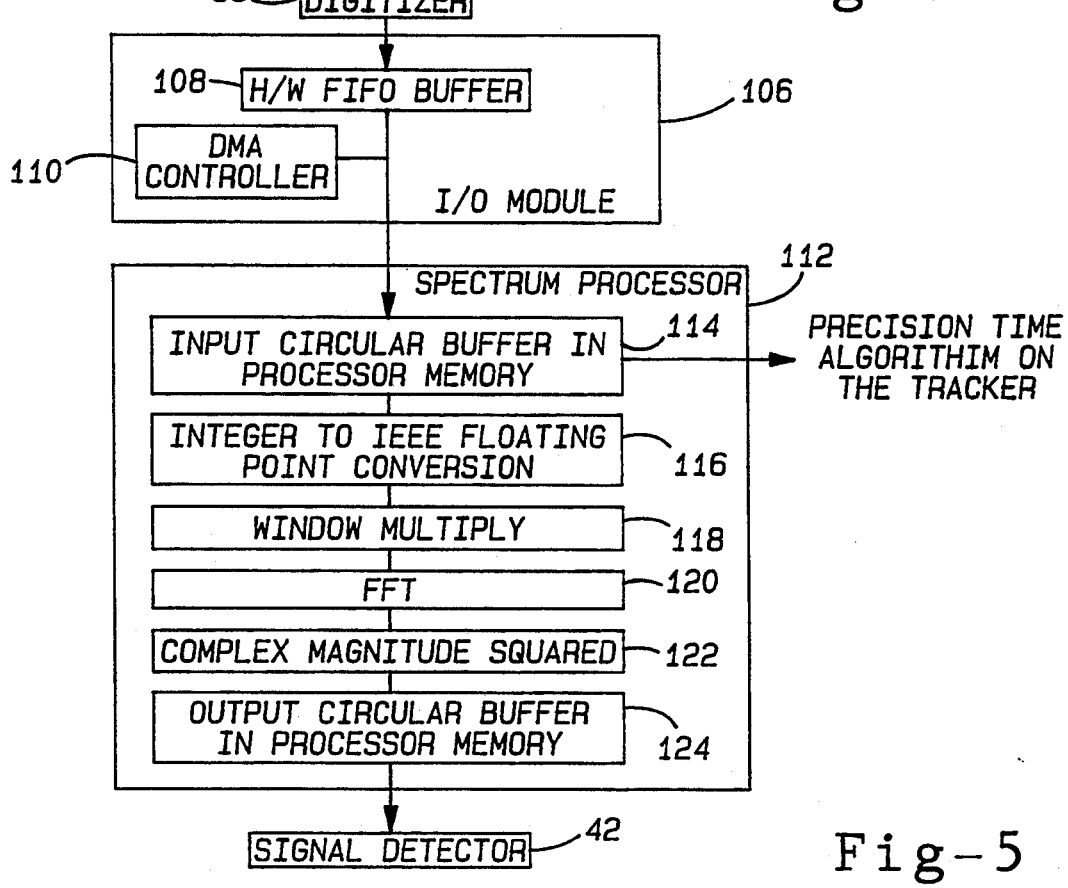
FIG. 5 is a block/flow diagram of a spectrum analyzer of the present invention.

An overview of the data flow and operations of the spectrum analyzer 40 is shown in FIG. 5. The PARINT system 14 implements this function on the 6U VME i860 card 58 (the MC860VB from Mercury Computer Systems) with the I/OMAX daughtercard. The digital data from the digitizer 38 is transferred through an I/O module 106 (I/O MAX daughterboard) containing a hardware FIFO buffer 108 and a DMA controller 110 to a spectrum processor 112. The digital data is then applied to an input circular buffer 114 via the DMA controller 110 and the hardware FIFO buffer 108. Once enough digital data has arrived, the spectrum processor 112 generates a power spectrum from the digital data. It first converts the digital data samples to IEEE floating point format 116, applies a window function 118, performs a FFT (Fast Fourier Transform) 120, and computes the magnitude squared 122. The output is then put into an output circular buffer 124 which is read by the signal detector 42 in the i860 card 60.

It should also be noted that the spectrum analyzer 40 does not need to process every sample that comes from the digitizer 38. While all data must be saved in the input circular buffer 114 for a period of time (e.g. 100 milliseconds), it is only necessary to analyze blocks of digital data that are regularly spaced in time, but that have large gaps in between. This is done in order to reduce the processing load. For example, if the FFT 120 uses 256 sample points, but it takes 350 microseconds to produce the power spectrum for a 256 point FFT 120, and it only takes 50 microseconds to collect 256 samples, then 300 microseconds of data is stored in the input circular buffer 114 but unused. The only requirement is that the exact acquisition time corresponding to the 256 samples is known. The size of the FFT 120 is a function of a desired bin spacing and the sampling rate. For example, for a 5.12 MHz sampling rate, a 256 point FFT 120 will produce 20 KHz bin spacing. If a higher sampling rate is used (usually because of a wider intercept bandwidth), then a larger FFT 120 may also be needed to meet the system performance goals.

The spectrum analyzer 40 acquires data from the digitizer 38 and utilizes this data to accomplish the power spectrum processing. As was stated above, only a regularly spaced subset of the raw data is actually processed to determine power spectrums. The example above showed a 350 microsecond processing time, but only a 50 microsecond time required to collect the 256 samples needed by the FFT 120. The data acquisition approach breaks up the input data stream into frames, where a frame corresponds to the time between starting new power spectrums. In this example, a frame would be 350 microseconds of data, and the last 256 samples of data would actually be used for the FFT 120. However, the full frame of data is stored in the input circular buffer 114, so that it can be read by the precision time algorithm in the tracker/database 44.

The concept of the data frame forms the basis for all timing in the PARINT system 14. The frame is defined as a specific number of A/D sample clocks (e.g. 2000). In the PARINT system 14, the utility card 66 has a sample counter that counts sample clocks up to the specified frame size. The frame size is programmable at run time by s/2 running any processor in the VME chassis 50. When the sample counter reaches the frame count, it outputs a frame pulse. This frame pulse goes to the frame counter 78, which counts the number of frame pulses that have been seen since it was last reset (at the initial start of the spectrum processor 112, but not on restarts). The frame counter 78 is read over the VME bus 52, and is the central clock for the partial intercept LPI reconnaissance system 10. The frame pulse also goes to the digitizer 38 at frame SYNC bit 102, where it is used to tag one of the unused bits in the data stream. Hence, when the spectrum analyzer 40 receives data into its input circular buffer 114, it can check the frame bit in the raw data samples in order to ensure that it knows at exactly what time (relative to the frame and sample counters) each sample was taken. For a frame count of 2000, every 2000th sample would be tagged with the frame bit. This sample corresponded to the same time that the sample counter reached the frame size. To determine the time of any sample between tagged samples, it is only necessary to know the index of the sample in question, because the sample counter generates pulses at regular and accurate intervals.

In order to synchronize the frame bit seen in the data with the exact value of the frame count, the following steps are used:

a) Turn off all processor interrupts, halt the DMA controller 110 or direct its output to a scratch buffer area, and zero out the entire output circular buffer 124.

b) Read the frame counter 78 value from the utility card 66.
c) Reset the hardware FIFOs 108 on the input I/O module 106.
d) Read the frame counter 78 again. If it has changed since step b), return to step b).
e) Start the DMA controller 110 that reads out the hardware FIFO buffer 108 and place the raw data into the input circular buffer 114.
f) Read the frame counter 78 repeatedly until it changes.
g) Look at every raw sample in the input circular buffer 114 until a sample with a frame bit tag is found.
h) Using the known number of samples per frame, index to the expected position of the next frame tag sample.
i) If the tag bit is already present, go back to step h). Otherwise proceed.
j) Read this sample index repeatedly until the tag bit shows up. Then immediately read the frame counter 78. You now know explicitly which frame count value corresponds to this particular frame bit, and hence, you know it for all future frame tags.
k) Restore processor interrupts.

In order to not loose any data samples, it is necessary that the DMA controller 110 on the I/O module 106 never halt long enough for the hardware FIFO buffer 108 to overflow. The DMA controller 110 is set up to transfer an input data stream to a specific block of addresses in the input circular buffer 114. On the Mercury i860 cards, this block can be up to 256K bytes, or 128K samples (a sample is a 16 bit word). When the block is done, it is necessary to quickly restart the DMA controller 110 before the hardware FIFO buffers 108 overflow. The hardware FIFO buffers 108 are preferably 1K samples deep. Ideally, the DMA controller 110 would be intelligent enough to do this automatically, however, the Mercury I/O card has to be set up by the spectrum processor 112 every time. Originally, this was done by periodically polling the state of the DMA controller 110 at various points in the code, and then restarting it if it had halted. However, as FFT 120 sizes grow from 256 points to 512 points, this scheme no longer works. The interrupt driver has thus been implemented, which is automatically executed when the DMA controller 110 is done, and sets up the DMA controller 110 again.

It is not strictly true that the last 256 (or 512, or . . . ) samples of a frame are used to perform the FFT 120 because of data alignment problems. The i860 card 58 needs the first sample of the set of 256 (or . . . ) to be aligned on an 8 byte boundary. This is because the i860 card 58 is inherently a 64 bit processor. Hence, when the spectrum processor 112 initially synchronizes the frame tags on the sample with the frame count, it also computes a sample index offset value (0 to 3). The actual first sample of the 256 that is used by the FFT 120 is really the frame tag sample minus 256 minus the offset. Hence, the first sample of the 256 will be aligned on an 8 byte boundary.

In order to support the precision time algorithm (which will be discussed shortly), the output power spectrums are tagged with an address pointer to the data frame that was used to produce the power spectrum. Hence, when the tracker/database 44 needs to copy the raw date in order to do precision time analysis, it uses these pointers to access the data directly from the VME bus 52 (using a DMA (Direct Memory Access) transfer) without the involvement of the spectrum processor 112.

If an error occurs in the spectral processing, such as an I/O glitch that caused the frame bit to not be where expected, then the software will first attempt to gracefully recover by looking for the frame tag near where it was expected. If it cannot gracefully recover, it will signal a stop condition to the PARINT controller (currently on the i860 card 60 containing the signal detector 42), and wait for a restart message. When the restart is received, it will attempt to resynchronize to the data from the beginning in the same way that it did at system startup.

Figure 6:
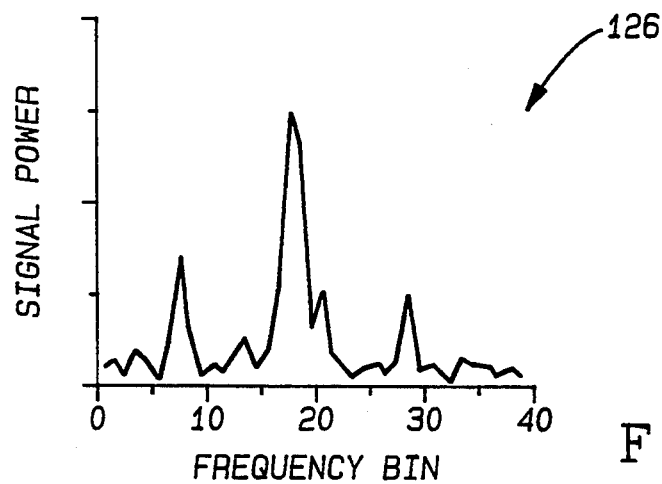
FIG. 6 is a power spectrum diagram generated by the spectrum analyzer.

The power spectrum is produced using the Fast Fourier Transform (FFT 120) method. This is the most efficient method of performing a spectral analysis for the partial intercept LPI reconnaissance system 10. The power spectrum is obtained by calculating the magnitude squared 122 of the complex output of the FFT 120 for those bins that are within the 3 dB passband of the single channel receiver 34. It is this power spectrum that is passed to the signal detector 42, along with the frame count and the raw data pointers. One power spectrum is produced every frame. An example of a single frame power spectrum 126 is shown in FIG. 6. The vertical axis corresponds to power, and the horizontal axis is frequency bin. Peaks in the spectrum indicate signals. The size of the FFT 120 must be a power of 2. The specific size chosen is a function of the sample frequency (which is in turn a function of the intercept bandwidth) and the desired frequency spacing of the bins in the FFT 120. The PARINT system 14 preferably has a 3 dB intercept bandwidth of 2.048 MHz, a sample rate of 5.12 MHz, an FFT 120 size of 256 points, and a bin spacing of 20 KHz.

In order to improve the dynamic range of the FFT 120 processing, the window function 118 is applied. The window function 118 has the effect of greatly reducing the sidelobes in the FFT 120 output, but does have the drawback of widening the main lobe. The window function 118 preferably used in the PARINT system 14 is a Blackman-harris window. The equivalent noise bandwidth (a measure of the effective bandwidth of the main lobe) is 32 KHz.

Figure 7:
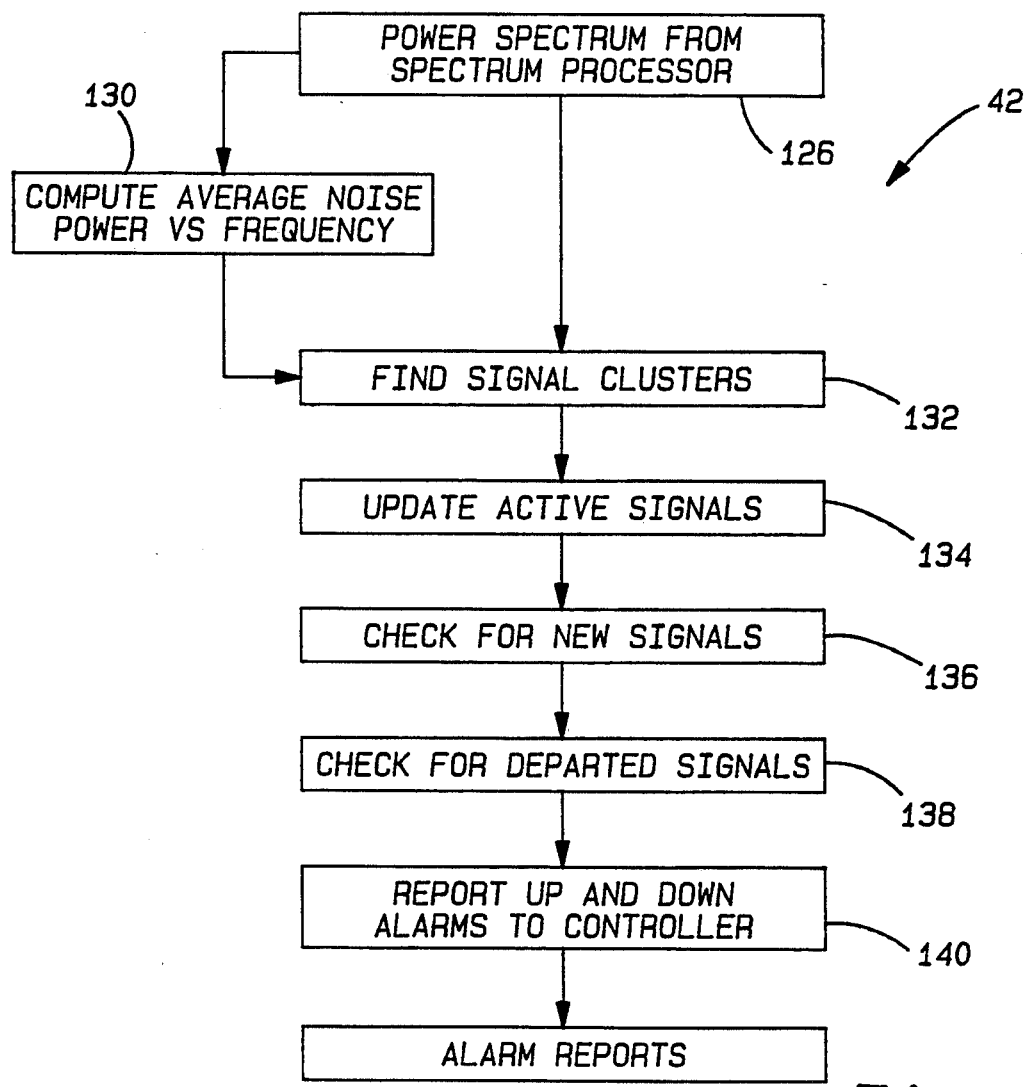
FIG. 7 is a block/flow diagram of a signal detector of the present invention.
Figure 8:
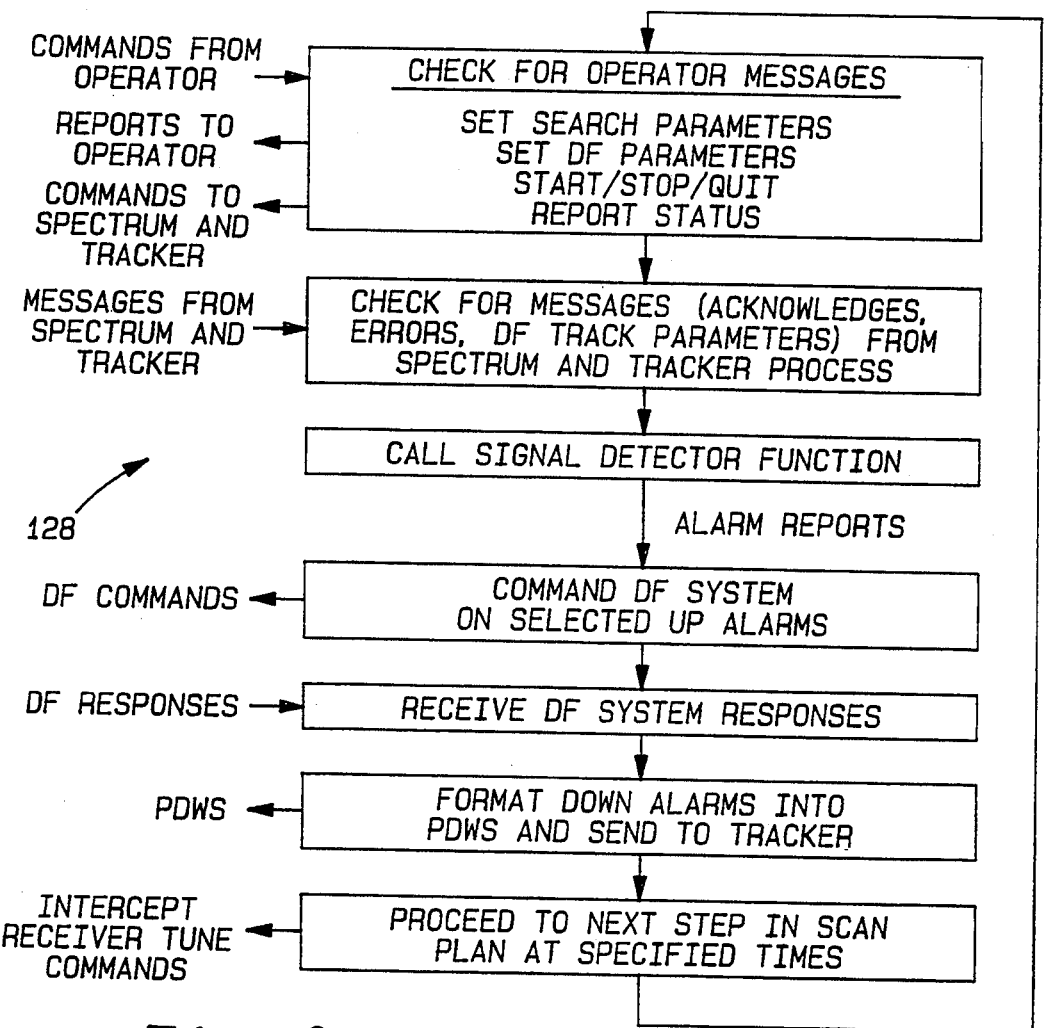
FIG. 8 is a block/flow diagram of the operations of a PARINT controller of the present invention.

The function of the signal detector 42 in the i860 card 60 is to analyze the power spectrums 126 (coming from the spectrum analyzer 40 in the i860 card 58) to determine if there are any signals present at various signal parameters. The signal parameters include the signal frequency, bandwidth, time of arrival (TOA), time of departure (TOD) and signal strength. When a signal is observed that arrives and then departs, this signal is termed a pulse, and a report of this pulse is made to the PARINT controller in the i860 card 60 and on to the tracker/database 44 in the form of a pulse descriptor word (PDW). The PARINT controller is the main program of the task that includes the signal detector 42 function. It has the added responsibility of providing DF commands to the DF system 12 on selected pulses based on the arrival time of the signal, but before the signal departs. The PARINT controller is also responsible for the real-time command and control of the PARINT system 14 operation, such as sending explicit start and stop commands to the other elements, and controlling the receiver scan plan. FIGS. 7 and 8 show a high level view of the signal detector 42 and the PARINT controller 128 operations.

An overview of the functions performed by the signal detector 42 is shown clearly in FIG. 7. The signal detector 42 gets power spectrums 126 for each frame from the spectrum processor 112. The power spectrum 126 is used directly by two functions. The first computes the average noise power 130, and the second identifies signal clusters 132. The signal clusters 132 found on every frame are then passed to a series of signal detection and maintenance functions. The first function 134 (update-active) determines if any of the current frame's signal clusters match any previously identified active signals. The second function 136 (new energy detector, NED) takes the unassociated clusters and determines if they are real signals or just noise by correlating the current frame's clusters with unassociated clusters seen on previous frames. The third function 138 (down energy detector—DED) determines if any of the previously identified active signals have gone down. Finally, the up alarms (new signals) and down alarms (departed signals) are reported back to the controller 128 in alarm reports 140.

In the PARINT system 14, the power spectrums 126 produced by the spectrum processor 112 are stored in the input circular buffer 114 in the spectrum processor 112. The signal detector 42 checks the output circular buffer 124 to see if there is a new power spectrum 126, and if so, it will set up is own DMA controller (not shown) to transfer the data to the signal detector's local memory (not shown). A double buffer method is used on the signal detector 42 so that it can be processing a received power spectrum 126 while the DMA controller is transferring a new power spectrum 126 into memory.

Figure 9:
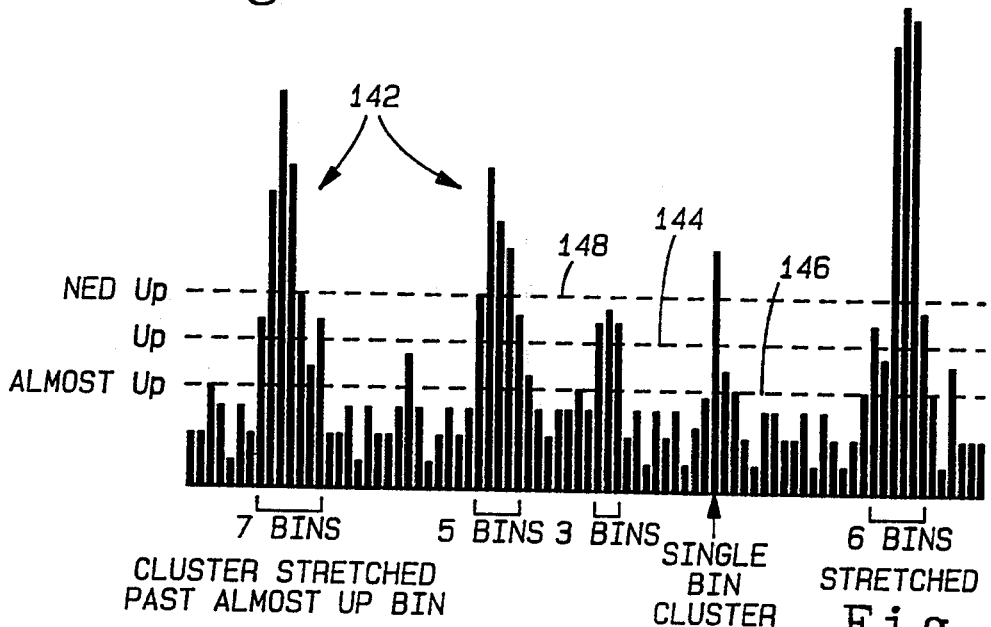
FIG. 9 is a power spectrum diagram displaying signal clusters.

The signal detector 42 identifies signals by comparing the power in each frequency bin to threshold values shown clearly in FIG. 9. The thresholds are given as specified levels above the spectral noise floor. A contiguous set of bins (or near contiguous—a gap of one or more bins can be allowed) above threshold forms a cluster 142. Essentially, a cluster 142 is a contiguous set of frequency bins that are believed to be from a single radio source. A single radio source will likely occupy more than one frequency bin due to the bandwidth of the signal and the nature of the FFT 120 and the window function 118. A clustering function (clustering algorithm) makes a list of the clusters 142 that it found in each power spectrum 126, and reports this list to the next stage of the signal detector 42 processing. There are really two thresholds: "up" 144 and "almost up" 146. A bin has to be above the up 144 threshold to start a cluster 142, but the cluster 142 can stretch across almost up 146 bins. A software parameter specifies the number of almost up 146 bins across which the cluster 142 can stretch (typically 1), Typical values for these thresholds are 4.5 dB for up 144 and 3.5 dB for almost up 146. FIG. 9 also shows a NED up 148 threshold. This NED up 148 threshold will be explained later in some detail.

Figure 10:
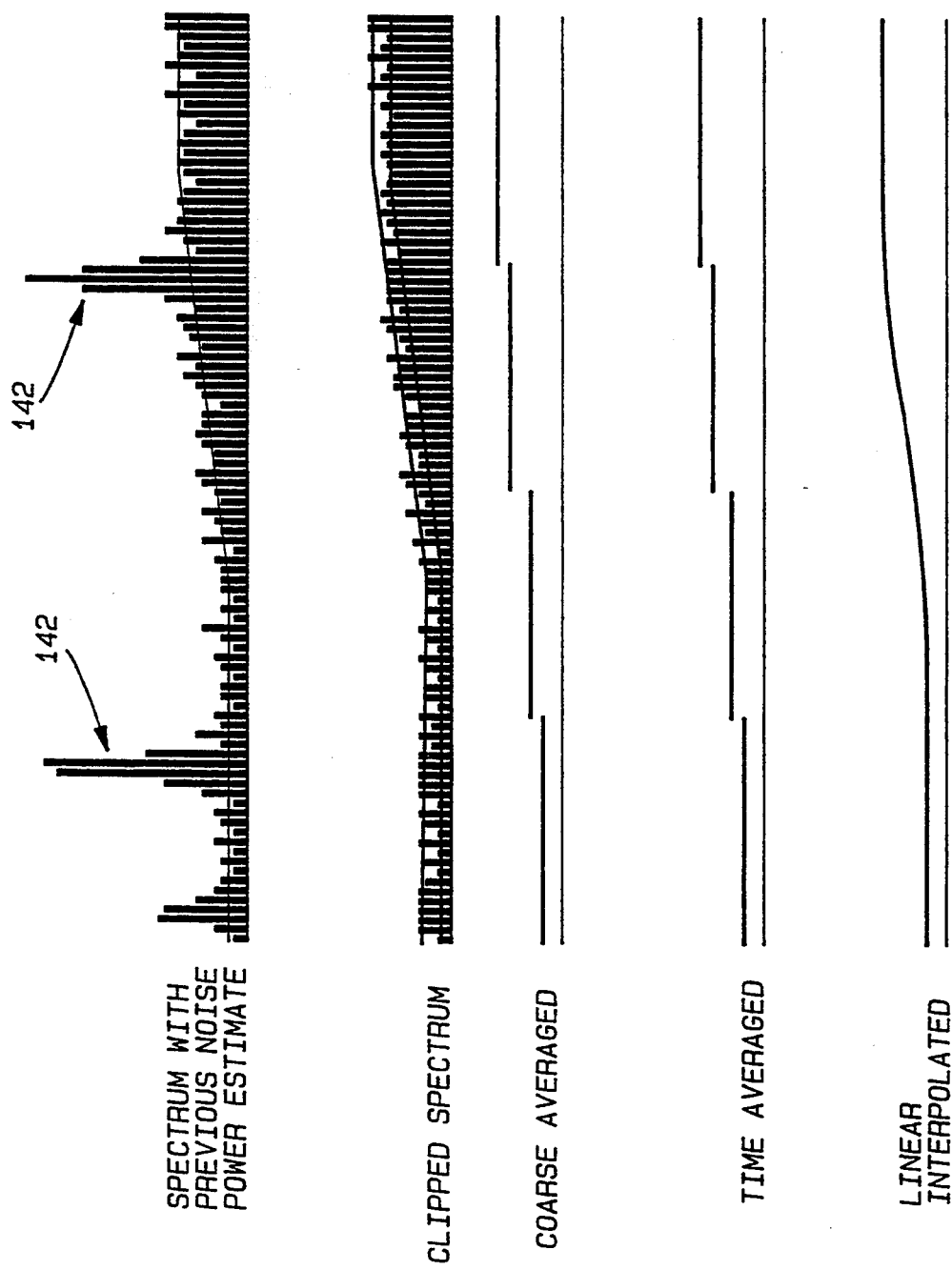
FIG. 10 displays how a noise power estimation effects the power spectrums.

In order for the clustering function to operate, it needs an accurate estimate of the noise floor. The noise floor estimation function is called every Kth frame (K is typically 20). Its algorithm is shown pictorially in FIG. 10. The estimation function first clips the power spectrum bin values at a specified thresholds above and below the previous noise floor estimate. A typical clipping threshold is ±3 dB. The average of the clipped spectrum is formed in preferably 500 KHz intervals (the interval is a parameter, and can be changed). Once this coarse average for each 500 KHz group is formed on the single frame, it is then averaged with previous estimates of the noise power for this interval using the following formula:

$$P_{time\_ave} = P_{old\_ave} \times \text{delta} + (1\text{-delta}) \times P_{current\_frame}$$

where $P_{current\_frame}$ is the average power for this interval on the current frame, $P_{time\_ave}$ is the time average noise power for this interval, $P_{old\_ave}$ is the previous time average, and a typical value for delta is 0.9.

The time averaged power in the 500 KHz intervals is then linearly interpolated to find the estimated noise power for each bin. If the 500 KHz interval is at the edge of the intercept window (e.g. 2 MHz), then the adjacent edge interval from the adjacent intercept step is used for the interpolation. For example, if the single channel receiver 34 is tuned to 31 MHz, so that it covers the frequency range from 30 to 32 MHz, and the edge interval is 31.5 to 32 KHz, the adjacent intercept window is the one that covers 32 to 34 MHz, and the adjacent noise power interval is 32 to 32.5 MHz. Hence, the noise power for the frequency bins above 31.75 MHz will be a linear interpolation of the power averages for the intervals centered at 31.75 and 32.25 MHz. If the scan plan did not go below 30 MHz, then the noise floor estimate for the bins below 30.25 MHz is simply the value of that interval average (i.e., it is flat, not sloped, below 30.25 MHz).

Before describing further how signals are detected, it will helpful to list the signal parameters that must be measured. The list of these parameters is shown below.

Up time: The time (frame number) at which the signal first was identified to be present.

Down time: The time (frame number) at which the signal departed.

Peak bin: The FFT bin 120 at which the signal peak power occurs. Due to signal modulation, this peak value can shift in time, but the recorded peak bin for an active signal is the peak bin during the initial signal identification process.

Peak value: The power of the peak bin on the frame at which the peak bin was identified.

Left value: The power of the bin to the left of the peak.

Right value: The power of the bin to the right of the peak.

Start bin: The lowest bin number that corresponds to the cluster. This defines the extent of the signal cluster to the low side.

Stop b in: The highest bin number that corresponds to the cluster. This defines the extent of the signal cluster to the high side.

Peak value sum: A sum of the powers of a signal's peak bin for every frame while the signal is active.

The new energy detection (NED) function identifies the presence of new signals by looking at a recent time history of the signal clusters 142 identified by the cluster function. It requires that a signal cluster 142 be identified by the cluster function on N of M contiguous frames in order for a signal to be officially declared active. A typical value of N is 3 and of M is 4. The reason that the NED function (NED algorithm) requires the signal cluster 142 to be seen many times in a row is because noise and interference can cause spurious signal clusters 142 to be identified on single frames, but the probability that such a spurious cluster appears many frames in a row at the same frequency is very small. The values for N and M can be varied in the software, and includes the case where N=M.

In order to keep signals near threshold to be going up and down a lot, the NED function has the additional NED up 148 threshold, shown in FIG. 9, which is higher than the up 144 threshold used by the clustering function. All of the clusters 142 that are considered "up" by the NED function have to be above this threshold. A typical value for this threshold is 6 dB above the noise flow, which is 1.5 dB higher than the up 144 threshold used in the clustering function. This built-in hysteresis makes it less likely that a signal near threshold to be declared down until it really does go down.

Due to modulation, noise and interference, the peak bin for a signal will move from frame to frame. Hence, a cluster 142 on a new frame is considered to be the same signal as a cluster 142 on a previous frame if the peak bins are within BIN_MARGIN bins of each other. Typically, the value of BIN_MARGIN is 1. For example, if a cluster 142 that had a peak at bin 47 on frame 200 is found, and then a cluster 142 at peak bin 48 is found on frame 201, then they are considered to be the same signal and get associated by the NED function. However, if BIN_MARGIN is 1 and the peak bin is at 49, then this is considered a different signal. If the cluster 142 on frame 201 has a larger peak bin power value than the cluster 142 on frame 200, then the peak bin for this candidate signal will be moved to 48, and the peak, left and right power values are updated with the new cluster 142. Once the candidate signal is promoted to an active signal, these parameters become fixed.

One of the cautions of moving the peak bin for a candidate signal is that candidate signals may merge, and care must be taken to merge the signals in an accurate way. For example, if there were two single bin clusters 142 in frame 200, one at bin 47 and the other at bin 49, and then a single cluster 142 is found at frame 201 at bin 48, and which had a larger signal power than either of the two previous signals, then the NED function assumes that this is really one signal and merges the two previous clusters 142. The up time is taken from the oldest of the two. Care must be taken in the software to free up the memory and pointers that were used for the eliminated candidate signal. When a NED candidate is promoted to an active signal, its cluster pointers are copied to the active list and it is reported to the PARINT controller 128 as an up alarm.

The updating of active signals is very simple. On every frame, the list of clusters 142 that are identified by the cluster function is sent first to a "update_active" function. This DFD function goes through all of the current frame's clusters 142 and determines if any of them have a peak bin that is within BIN_MARGIN of an active signal. Those clusters 142 that are associated to an active signal are used to update the active signal parameters, such as down time and peak power sum. The clusters 142 that were unassociated are sent on to the NED function.

Once the current frame's clusters have been used to update active signals, a down energy detect (DED) function is called to determine if any of the previously active signals has departed. This DFD function goes through all active signals (that are within the frequency range of ,the current intercept bandwidth—e.g., 2 MHz) and cheeks to see if they were updated with a cluster 142 on the current frame. If a signal had no "hits" this frame, then it is put on a candidate DED list (and also left on the active list). The DED function (DED algorithm) uses an N of M approach similar to that of the NED function. If there is no cluster 142 observed at the previously active signal frequency for N of M contiguous frames, then the signal is declared down, removed from the active and DED lists, and reported back to the PARINT controller 128. Typical values for N and M are 3 and 4 respectively. The DED function is simpler than the NED function only in that it does not have to determine peak bins or update power value parameters.

As was previously indicated, the same processor that hosts the signal detector 42 also hosts the PARINT controller 128 (also known as the signal detector controller, or simply, the controller). FIG. 8 shows the basic operations of the PARINT controller 128. The PARINT controller 128 is responsible for receiving and processing control messages from the operator at the monitor/workstation 46, sending back status reports to the operator, starting and stopping spectrum analyzer 40 and the tracker/database 44, calling the signal detector 42, interfacing with the DF system 12, and repolling pulse descriptor words (PDWs) to the tracker/database 44. It also controls the single channel receivers 34 frequency scan plan. It is implemented as a continuous loop.

The messages that are received from the operator are relatively simple. One function of the PARINT controller 128 is to receive these messages and process them appropriately. A list of the messages are shown below, along with the PARINT controller's 128 actions.

Start: Signal the partial intercept LPI reconnaissance system 10 to start operation. The PARINT controller 128 first commands the single channel receiver 34 to tune to the first step in the frequency scan plan. Once the tune is complete, the PARINT controller 128 commands the spectrum analyzer 40 and the tracker/database 44 processors to start. The spectrum processor 112 will then synchronize to the frame bit in the raw data stream and start processing power spectrums 126. The signal detector 42 and the tracker/database 44 are really data driven, and all of their initialization takes place at system boot time, so the start message means little to them.

Stop: Signal the partial intercept reconnaissance system 10 to Stop. The PARINT controller 128 commands the spectrum analyzer 40 and tracker/database 44 processors to stop operation, in addition to stopping the scan plan operation by the PARINT controller 128. Again, since the signal detector 42 and the tracker/database 44 are data driven, the major effect of this message is to stop the scan plan and the spectrum analyzer 40 generation of power spectrums 126.

Quit: signal the partial intercept reconnaissance system 10 to shutdown. The PARINT controller 128 passes this message on to the spectrum analyzer 40 and the tracker/database 44 processors, and then exits its program. Spectrum analyzer 40 and the tracker/database 44 do likewise.

Set scan plan parameters: Parameters include scan range, frequency ranges to skip, fixed frequency mode, and step dwell time. The PARINT controller 128 uses the parameters when deciding what the next intercept frequency should be.

Status: Show the partial intercept reconnaissance system 10 status. The PARINT controller 128 sends back a message to the operator that includes the current frame counter value, current intercept frequency, detection thresholds, current noise floor estimate, number of down alarms processed, and other status values.

Set thresholds: Set NED up 148, up 144 and almost up 146 thresholds.

Download barlist: Download the frequency bar list.

DF parameters: The DF parameters include if any tracks should get DF, or what specific tracks should get a DF.

A scan plan consists of a list of frequencies to which the single channel receiver 34, also known as the intercept receiver 34, must tune. At each step of the scan plan, the intercept receiver 34 will stay tuned to a particular frequency for a period of time known as the step interval or dwell. This step interval is typically 150 milliseconds, but can be changed by the operator. There can be 30 or more steps in a scan plan.

When the PARINT controller 128 retunes the intercept receiver 34, it must first pause the acquisition of data in the spectrum processor 112 so that those frames that are corrupted by the retuning of the intercept receiver 34 are not passed on to the signal detector 42. This pause is done using a flag in a shared memory area (mapped across the VME bus 52). The spectrum processor 112 always checks this flag before processing another frame. In addition, the PARINT controller 128 must inform the signal detector 42 that the intercept frequency has changed. When the intercept receiver 34 has completed tuning, the PARINT controller 128 will unpause the spectrum processor 112, which will, in turn, allow the signal detector 42 to proceed. (Recall that the signal detector 42 is data driven, as opposed to being explicitly paused.)

When the PARINT controller 128 steps to a new frequency in the scan plan, the signal detector 42 will generally pass back a significant number of up and down alarms in the first few frames of the new step. This is because this frequency has not been observed for a few seconds, and the signals may have changed during that time gap. The PARINT system 14 is really only interested in up and down alarms that have good time accuracy, so it needs to ignore any changes that occurred during the time that it was away from this frequency step. Hence, the PARINT controller 128 maintains two variables called Alarm_valid_count and Alarm_prev_valid_count. Alarm_prev_valid_count is the frame count value at the last good frame of the previous step in the scan plan. Alarm_valid_count is the frame count value of the first valid frame of the current step, plus M+2 frames, where M is the number of frames used in the new energy detector N of M algorithm (e.g., 4). (The value of +2 is just a buffer time period.) If an up or down alarm times are between Alarm_prev_valid_count and Alarm_valid_count, then the alarm is dropped. For a down alarm, if the up time is before Alarm_prev_valid_count and the down time is after Alarm_valid_count, then the alarm is dropped. In this way, only those signals that started M+2 frames after the beginning of the current step and ended before the last frame of the current step are kept.

The PARINT controller 128 is also responsible for sending pulse DF commands to the DF system 12 and receiving the DF responses back. The controller 128 decides which up alarms will generate a DF request by comparing up alarm times to a list of active track parameters that have been given to it by the tracker/database 44. If the DF system 12 is available and the up alarm matches an active track, then a DF measurement will be requested.

The tracker/database 44 will only send to the PARINT controller 128 those track parameters for the tracks that need a DF measurement. The tracker/database 44 will send updates to this list about once per second. In turn, the PARINT controller 128 will delete any entries from this list that are more than a second old. In this way, there is no need for the tracker/database 44 to inform the PARINT controller 128 when to take a track off the list. In order to determine if an up alarm matches an active track, the PARINT controller 128 compares the signal strength and the up time to the track parameters. The track parameters contain the average signal strength, the pulse period, and the up time of the last pulse that was associated to the track before the track parameters were passed over to the PARINT controller 128. A pulse phase comparison is made to determine if there is an up time match. The pulse phase gate is generally more restrictive in this case than it is in the tracker/database 44. The pulse phase gate in the tracker/database 44 is typically 1.3, whereas it is 0.7 here. This smaller gate means it is more likely that the DF will be due to a real pulse for one of the requested tracks, so that the DF system 12 is more efficiently utilized. Of course, it also means that many good pulses will not trigger a DF request.

When the PARINT controller 128 makes a DF request based on the starting edge of a pulse, it places the pointer to the signal detectors 42 active cluster 142 that caused the request onto a list of outstanding DF requests. When this active cluster 142 goes down, the DF response will not have yet returned. The PARINT controller 128 does not allow the cluster 142 to be converted to a PDW and sent on to the tracker/database 44 until the DF response comes back. There can be more than one DF request outstanding at a time, because the DF system 12 does not return the DF data immediately after taking the measurement cycle. However, the DF system 12 does send a message back to the PARINT system 14 immediately after it completes a measurement cycle, so that the PARINT controller 128 will not request a DF if there is a measurement in progress. The reason that the DF system 12 does not send the full DF response back right away is that it attempts to calculate an angle of arrival (AOA) 30 after it is done with the measurement cycle and before sending back the response. However, while it is calculating the AOA 30 on one pulse DF measurement, it can also be performing the DF measurement cycle on the next pulse DF request. Hence, more than one pulse DF request can be outstanding at one time.

The tracker/database 44 is responsible for identifying and maintaining information on the observed LPI RF signal transmissions and networks. These responsibilities include identifying LPI radio type (based on signal duration and frequency band), association of LPI signal pulses with known active transmissions, associating of LPI signal pulses to form new active transmissions, association of the active transmissions with a previously identified network (based on radio type, frequency band, pulse phase and possibly LOB-Line of Bearing, the direction of the transmitter), and the creation of previously unidentified networks. The tracker/database 44 also maintains the list of DF measurement data for each active transmission. This task will generate automatic reports of network information and respond to manual requests for information by the operator.

The basic steps taken by the tracker/database 44 is shown in FIG. 11. When a new pulse (PDW) is received by the tracker/database 44, it identifies the radio type, then determines if it matches one of the active transmissions in the "official" database (a match is determined by the PARINT pulse phase tracking algorithm, which is described in detail later). If it matches, it associates the pulse with the active transmission, updates the active transmissions parameters, and goes to get the next pulse. Otherwise, it determines if the pulse matches one of the candidate transmissions. If it matches, the candidate transmission parameters are updated. If it doesn't match, then the new pulse is entered into the candidate database as a candidate transmission with only one pulse detected.

The simple description given above is modified by the precision time algorithm. If the tracker/database 44 determines that the pulse will be associated with an "official" active transmission or with a maturing candidate transmission, then instead of updating the transmission parameters immediately, a precision time analysis of the down time of the pulse is made. The initial pulse association is done with a coarse time that is given by the spacing (e.g. 350 microseconds) of the power spectrums 126 that are produced by the spectrum analyzer 40. Once the signal detector 42 has identified the existence of a pulse and the tracking algorithm has preliminarily associated it with an active or maturing transmission, the tracker/database 44 retrieves the raw digitized data from the input circular buffer 114 in the spectrum processor 112 just for the time period near the down time of the pulse (three frame's worth of data, e.g. $= -3 \times 350$ microseconds worth of data). The precision time algorithm then determines the precise time that the pulse went down with a typical accuracy (standard deviation of error distribution) of 15 microseconds (for 15 dB SNR signals). The tracker/database 44 then goes through the association process again to find a match of the updated pulse with an active or maturing transmission. If there is a match, then the transmission parameters, are updated with this accurate time data.

A step by step listing of the actions taken by the tracker/database 44 for a single pulse is shown below. The actual implementation makes use of double buffering schemes to increase the processing and data movement efficiency.

a) The tracker/database 44 receives a pulse descriptor word (PDW) from the signal detector 42. If the frequency of the pulse was on the list of barred frequencies (frequencies that have high false alarm rates), then discard it and go back and get another PDW.

b) The tracker/database 44 attempts to identity the LPI radio type by comparing the pulse time duration (and potentially frequency) to a list of known radio types. Different radio types generally have different characteristic pulse durations.

c) The tracker/database 44 then determines if the pulse could match one of the active transmissions (of the same radio type) in the "official" database by comparing timing information using the PARINT pulse phase tracking algorithm. If it does not match an active "official" transmission, it then compares the pulse phase with candidate transmissions of the same radio type in the candidate database. If there is still no match, the pulse is entered into the candidate database as a candidate, and the tracker/database 44 returns to step a). If there is a match with an immature candidate, then the pulse is associated with the candidate, the candidate parameters are updated, and the tracker/database 44 returns to step a). If the pulse matches an active or maturing candidate, then the tracker/database 44 goes on to step d).

d) The pulse has matched an active or maturing transmission, so the tracker/database 44 will perform a precision time measurement. The tracker/database 44 retrieves the raw digitized data from the input circular buffer 114 in the spectrum analyzer 40 for the time period near where the pulse went down (three frames worth of data centered at the last time the signal was up, plus an additional fft-size [e.g. 256 or 512] samples from just before the first full frame brought over). The tracker/database 44 performs the precision time measurement (described later), and updates the down time in the PDW and the estimated accuracy (variance) of the down time estimate.

e) The tracker/database 44 attempts to associate the "precision time" pulse with an active transmission in the same manner that it did before with the coarse time. If there is a match, then the active transmission parameters are updated and the tracker/database 44 returns to step a). If there was not a match, the tracker/database 44 attempts to match the pulse with a candidate transmission. If there was a match, the candidate transmission parameters are updated and the tracker/database 44 returns to step a). If there was no match, the pulse is discarded, and the tracker/database 44 returns to stop a).

In order to improve throughput, a double buffering scheme is used when requesting a precision time analysis. If a precision time analysis was requested on a particular pulse, then a DMA controller (not shown) on the i860 card 62 containing the tracker/database 44 is set up to bring the raw data into a local buffer. While this transfer is occurring, the tracker/database on the i860 card 62 will go back to step a) and get another PDW, and go through the process outlined above. However, the next time the tracker/database 44 goes back to step a), it will first check to see if there is a completed DMA request for raw data. If there is, it will skip to step d), perform the precision time analysis, and then go on to step e), where it will attempt to associate the pulse to a track, but using the more accurate time of departure for the pulse. This method means that pulse entries into the tracker/database 44 could go out of time order, but they will be in order for any given track. The pulses stay in order for a given track because if track 4 is requesting precision time analysis on all new pulses, then any pulses that would be associated with it would have gone through the precision time process, and would be in time order. However, immature candidate track 2 could be updated with a coarse time pulse that is out of time order with the precision time pulse that updates track 4. This is irrelevant because we only care about the time order on any particular track.

Turning to FIG. 12, FIG. 12 illustrates how the PARINT tracking algorithm exploits the pulse phase of a LPI RF signal. The top part of FIG. 12 shows the timing of a regular pulse train with only a fraction of the pulses intercepted (detected pulses). The bottom of FIG. 12 shows the pulse phase (expected time minus measured time) on the vertical axis versus time on the horizontal axis. The band centered around zero is the pulse phase of the pulse train shown above. The other band (near $+\frac{1}{2}$) indicates that another radio of the same radio type is also transmitting, but its pulse phase is offset from the first radio. This is the primary way that the tracker/database 44 differentiates radios of the same radio type, but of different networks.

The PARINT pulse phase tracking algorithm takes advantage of the fact that the current generation of radios of this type have regular and predictable times at which pulses arrive and depart. The time at which the pulses depart (called time of down, TOD) is given by the following formula:

$$\text{TOD} = P_{period} \times n + T \quad \quad 1)$$

where $P_{period}$ is the pulse period (e.g. a radio may pulse once every 10 milliseconds = $P_{period}$), T is the time that the transmission began, and n is the pulse number (n increments by one every pulse, and is 0 at T).

An active or candidate transmission that is being maintained by the tracker/database 44 has estimates of the Period and T in its database. Initially, Period is obtained from a table of known radios, and T is the time at which the first pulse from this transmission was detected by the tracker/database 44. In order to determine if a new pulse could be associated with an active or candidate transmission, the pulse phase is determined with the following formulas:

$$N = \text{round\_to\_integer}((\text{pulse\_tod} - T_{last\_fitted})/P_{period\_fitted}) \quad \quad 2)$$

$$T_{expected} = P_{period\_fitted} \times N + T_{last\_fitted} \quad \quad 3)$$

$$\text{pulse\_phase} = \text{pulse\_tod} = T_{expected} \quad \quad 4)$$

where N is the number of periods since the last time a pulse was associated with this track, pulse\_tod is the pulse's down time, $T_{last\_fitted}$ is the tracker/database 44 estimate of the best fitted time (using a linear least square's fit) of the last (most recent) pulse that updated this track, $P_{period\_fitted}$ is the tracker/database 44 estimate of the true period, $T_{expected}$ is the expected time of the pulse, and pulse\_phase is the time deviation of the measured time from the expected time.

In order to declare that this pulse matched the transmission, we require that the signal strength match within D decibels (D is typically 6 to 10) of the active or candidate transmission, that the frequency of the pulse be consistent with the possible frequency range of the active or candidate transmission, that the LOB match (if available), and that the absolute value of the pulse\_phase be less than a gate value, which is given by the following formulas:

$$\text{pulse\_phase\_variance} = \text{pulse\_tod\_variance} + T\text{-fitted-variance} + N \times N \times P_{period\_fitted\_variance} \quad \quad 5)$$

$$\text{gate} = \text{sqrt}(3 \times \text{pulse\_gate} \times \text{pulse\_gate} \times \text{pulse\_phase\_variance}) \quad \quad 6)$$

If the absolute value of the pulse\_phase is less than this gate, then there is a pulse phase match. Note that these formulas work for both coarse and precision time measurements. The precision time measurement simply has a smaller pulse\_tod\_variance. All fitted variances are based on a standard least squares fitting technique. A typical pulse\_gate value is 1.3, and can be changed in the software. In addition to the above match requirements, we can also require that the pulse LOB match the transmission LOB to within A degrees (e.g. A=15) if LOB is available on every pulse.

When a pulse is matched to a transmission, the transmission parameters must be updated with the new pulse data. The relevant parameters are the average pulse duration, the fitted period, and $T_{last}$. A standard least squares fit to equation 1 is done to update $P_{period}$ and $T_{last}$ parameters, and their estimated variances. For the first few seconds after a transmission becomes active (and while still in the candidate process), the sums for the least squares fit are made, but the $P_{period}$ is just the tabulated value (of known transmitters) and $T_{last}$ is the time of the last associated pulse. The duration is a simple average. The tracker/database 44 also updates the frequency usage histogram with the frequency of the current pulse. The tracker/database 44 will begin to use the fitted period and variance in equations 2, 3 and 5 when the fitted period variance becomes less than the variance of the known period in the standard transmitter table.

One of the key advantages of the PARINT system 14 is its ability to obtain a very accurate timing on every pulse that is associated to an active transmission or to a maturing candidate transmission by utilizing the precision time algorithm. This increase in accuracy allows the PARINT system 14 to separate up to 10 times more transmitter networks of the same type than it would otherwise be able to do with just the coarse frame time accuracy (approx. 350 microseconds).

Because the PARINT system 14 only intercepts and processes a fraction of the pulses that the LPI transmitter is actually sending, it is able to perform additional processing (precision time algorithm) to determine the precise time that a pulse departed. It does so by taking the raw data from the input circular buffer 114 in the spectrum processor 112 near the time the pulse departed. It takes over 3 frames of data plus one extra fft size worth, centered at the time the pulse departed. For example, if the pulse was up at frames 100 and 101, but was down at frames 102 and 103, and assume that the fft size is 256 real samples, then the last 256 samples from 100 plus all of the samples of frames 101 through 103 would be copied from the input circular buffer 114 to the tracker/database 44 (using fast DMA-VME 64 on the Mercury i860 cards). If a frame size is 2000 samples, this amounts to $3 \times 2000 + 256 = 6256$ samples.

Once the tracker/database 44 has the raw sample data, it attempts to find the precise down time. Because the tracker/database 44 already has the frequency of the pulse of interest, there is no need to perform a full FFT in order to filter out the frequency of interest. Instead, one row of a DFT is used to isolate the frequency bins of the pulse center plus one bin to either side. In order to further improve efficiency, a binary search algorithm is employed. The binary search algorithm first checks the powers in the pulse bins in the center of the 6256 samples and determines if the signal is up or down. If the signal is up, it will then check the powers in the center of the upper half (at the 75% point), whereas if it is down, it will check the powers in the center of the lower half (25% point) of the raw data. By doing it this way, much of the raw data need never be processed.

In order to determine if the signal is up or down, a simple binary moving window detector employing a 2 of 3 detection logic is applied. At a given start sample number, the power in three adjacent bins is determined and checked against a detection threshold. This alternate threshold improves the timing accuracy of high SNR signals. The start sample number is then advanced by fft_size/2 samples, and another power check is made, and then the sample number is advanced by another fft_size/2 samples, whereupon a final threshold check is done. The signal is considered up if at least 2 of these 3 checks were above threshold. The detection threshold for a low SNR signal is the same signal detection thresholds used by the signal detector 42. For high SNR signals, an alternate threshold is used, which is the average signal strength minus 6 dB. (Essentially, the maximum of the standard threshold or the signal strength—6 dB is used.) The 6 dB value is a parameter that can be changed in software.

A step by step procedure for the precision time algorithm is shown below.

a) The tracker/database 44 determines that the pulse matches an official active transmission or a maturing candidate.
  b) The tracker/database 44 copies the raw sample data from the input circular buffer 114 to the tracker/database 44.
  c) The tracker/database 44 calls the precision time analysis subroutine
  d) The precision time subroutine computes a detection threshold, which is the maximum of the standard signal detection threshold (which was passed over to the tracker/database 44 inside of the PDW, for each of the three bins) and the average signal power minus an offset (typically 6 dB).
  e) The precision time subroutine sets its raw data pointer to the center of the raw data buffer, and sets a high side pointer to the number of samples—(3/2) fft_size (for the 2 of 3 algorithm), and sets a low side pointer to 0.
  f) One row of a DFT that corresponds to the center bin of the pulse signal is applied to the raw data. The DFT is of the same length and uses the same window function as the FFT 120 in the spectrum processor 112. The power is then computed.
  g) If the power of the center bin is above threshold, go to step j).
  h) The power of the left bin is computed using one row of a DFT. If the power is above threshold, go to step j).
  i) The power of the right bin is computed and compared to the threshold.
  j) If less than 3 frames of this group have been checked (for the 2 of 3 algorithm), advance the raw data pointer by fft-size/2 (e.g. if fft_size/2 is 256 samples, advance the pointer by 128 samples), and go back to step f).
  k) If 2 of 3 of the times in this group of 3 pass, then the signal is up and the low side pointer is moved to the starting raw data pointer for this group. If 2 of 3 did not pass, then the high side pointer is moved to the starting raw data pointer for this group.
  l) If the difference between the high side and low side pointers is less than or equal to fft-size/2, then this is as accurate as we can get the time. If this time corresponds to the beginning or end of the raw data buffer, return from the subroutine with a return value that indicates that the precision time analysis was unsuccessful. Otherwise, update the pulse parameters with this time, change the pulse time variance estimate to be the estimate precision time variance, and exit the subroutine.
  m) If the difference between the high side and low side pointers is greater than fft-size/2, set the raw data pointer to the midway point between the low and high side pointers, and then go back to step f).

In order to speed the processing, the software is implemented such that the raw data, high side and low side pointers are always an integral number of fft_size/2 samples. Also, the DFT coefficients modified by the window function 118 are precomputed at initialization time for all bins.

The above sections have described the basic steps the PARINT system 14 performs to track a transmission, but does not go into detail on how a transmission is originally acquired and maintained, this will now be discussed. The process in the tracker/database 44 that recognizes new transmissions and forms a track for them is called the candidate tracker. The candidate tracker uses a simple multiple-hypothesis algorithm, combined with the usual pulse phase algorithm described previously. The input to the candidate tracker is the pulses whose duration correspond to a known radio type and who did not get associated to an active transmission track, and the table of known radio types, from which an initial estimate of the pulse repetition interval (PRI—i.e. pulse period) is obtained. The output of the candidate tracker is tracks which are promoted to the active transmission list.

The candidate tracker algorithm essentially tries to match a new incoming pulse against all candidate tracks of the same radio type, using the algorithm described in equations 1 through 6. It will attach the pulse to the candidate track that had the best match (based on pulse phase, signal strength, frequency band, and LOB if available) and was within the match acceptance criteria. If the pulse does not match any candidate track, but the duration does correspond to one of the known radio types, then the pulse will be entered into the candidate database as a new track. If there is an ambiguity as to radio type, then a candidate track will be created for each of the ambiguous radio types. As a candidate track gets more pulses associated with it (i.e. it matures), it will request that a precision time analysis be performed on new pulses that could be associated with it. Once the candidate track has had N number of pulses associated within X seconds (e.g. N=6 and X=5), and there has been at least one precision time pulse associated with the track, the candidate track will be promoted to being an official active track, and removed from the candidate database. Candidate tracks are regularly cleaned up so that pulses on the track that are older than X seconds are dropped from the candidate track. If a candidate track's most recent pulse is older than X seconds, then the track is deleted.

To illustrate how this process works, first assume that the candidate tracker is initially empty. A new pulse arrives which corresponds to a known radio type, e.g., type A. Because the data base is initially empty, this pulse is entered into the candidate database as a track that happens to only have one pulse observation. The pulse period for this track is taken from the table of known radios, where the pulse duration was used to identify which radio entry in the table is to be used. If the pulse duration match more than one radio type in the table, then a track for each radio type that it matched will be entered into the candidate database. For example, if the pulse duration was matched to radio types A, B, and C, then this single pulse causes three candidate tracks to be created in the candidate database. The pulse signal strength, frequency, and LOB (if available) are also entered into the track parameter list.

Now that the first pulse has created one or more tracks, assume a second pulse arrives, and that it corresponds to the same radio type(s) that the first pulse did. The pulse will be correlated against all candidate tracks that have the same radio type(s). If there is a match within the specified pulse phase, strength, frequency and LOB (if available), then the pulse will be associated with the track and the track's parameters updated for the pulse if the track is still considered immature. An immature track is one that has less than M pulses associated with it. If the track is maturing (greater than or equal to M pulses), then a precision time measurement will be requested for this pulse. If the pulse matched more than one candidate track, then the pulse will be associated to the track that had the best match in pulse phase. If the pulse matched more than one track and one of the tracks was a maturing track, then a precision time measurement will be performed for the pulse, even if the best matching track was immature.

If a precision time measurement was requested for a pulse, then the pulse association to candidate tracks will be performed all over again, but this time with the precise time. The one difference is that if the pulse did not match any of the candidate tracks (which should rarely happen), then the pulse will be discarded, rather than creating its own candidate track.

In order for a candidate to be considered mature, it must have at least M pulses associated with it, and in order for it to be promoted, it must have at least N pulses associated with it in X seconds. Typical values would be M=3, N=6, and X=5 for a 100 pulses/second radio transmitter. However, the values of M and N can be scaled to higher values for higher pulse rates. For example, the value of M is scaled by the following simple formula:

$$M_{rate} = M_{100} \times (rate/100)^S, \text{ minimum } M_{rate} \text{ is restricted to 2.}$$

where "rate" is the pulse rate of the radio (e.g. 150 pulses per second), $M_{100}$ is the value of M for a 100 pulses/second radio (e.g. $M_{100}=3$), and the best value of S is determined by experimentation. Values of S may range from 0.5 to 1. The reason for scaling M for different rates is that higher pulse rates means shorter durations, and shorter durations are more easily mimicked by noise. Hence, you need to associate more pulses on a candidate track to allow it to mature or to be promoted to being official in order to ensure that you don't report false tracks. (The value of N scales similarly.) The above equation for M and N is ad hoc, and one skilled in the art would recognize that other formulas may be substituted in order to optimize performance.

When a candidate track is updated with a new pulse, a linear least squares fit is performed to determine the best fitted pulse rate and pulse time. The least squares fit uses five sums to do this calculation, and every time a new pulse is added, these sums are updated. However, when a candidate matures and the first precision time is added to the track, these sums are cleared, and restarted with the precision time information. Subsequent pulse associations will always be precision time pulses, and the least squares sums will be updated accordingly.

A simple summary of the conditions for creating, maturing and promoting a candidate track are listed below.

a) A new candidate track is created by a coarse time pulse that was not associated to any other candidate track, but did correspond to a known radio type.

b) A candidate track is matured when M pulses have been associated with it within X seconds. A mature candidate track is one that will request precision time measurements for all pulses that will be associated with it in the future. The value of M is scaled according to pulse rate.

c) A candidate track is promoted to being an active track when N pulses have been associated with it within X seconds and at least one precision time pulse has been associated with the track. Note, this means the N>M.

Once the candidate process has promoted a track to being an active track, it must be maintained as an active track and finally deactivated when activity ceases. The tracker/database 44 does this when it receives a PDW, identifies the radio type based on duration, and attempts to find a match with one of the active transmissions. If there is a match, then a precision time analysis is requested. If the precision time algorithm returns successful, then the tracker/database 44 again tries to find a match with an active transmission. If a match is found, then the active track is updated with the pulse. If more than one match is found, then the track that had the best pulse phase match will be updated with the pulse. A track is deactivated when there has been no pulses associated with it in the last Y seconds. A preferable value for Y is 3 seconds.

In order to use the DF system 12 and other lower cost wideband DF systems, the PARINT system 14 does not require that the DF system 12 get a full DF measurement cycle on a single pulse. The tracker/database 44 is able to maintain a list of raw DF measurement data from many pulses for each track and then use a multiple frequency DF calculation to determine the AOA. When utilizing the DF system 12, the tracker/database 44 stores raw DF measurements in a list on the track for which the pulse (that had the DF measurement) was associated. In general, there will not be enough DF data measured in order to form a good LOB. The raw data consists of those baselines 18 (antenna pairs) that had signal power. The stored values are corrected baseline phase (2 bytes), a calibration table pointer (4 bytes), and a frequency interpolation factor (2 bytes). When this list gets sufficiently long (e.g. greater than 8 baselines 18), the data is sent to the multiple frequency AOA algorithm for an AOA calculation 30. The AOA results are returned to the tracker/database 44 with a success or failure indicated. If it was successful, those baseline 18 measurements that were used in the AOA calculation 30 are deleted from the list. Otherwise, the AOA calculation 30 will be attempted again after more DF measurements are added to the list. Old DF measurements (e.g. older than 15 seconds) are also deleted from the list and not used in the AOA calculations 30. This is done because if the antenna array 16 is located on an airborne system which is moving, the AOA is changing over time.

In order not to overload the DF processing, the tracker/database 44 does not always request DF measurements on all active tracks. It will request measurements when the track initially becomes active, and it will request periodic updates (e.g. every 10 or 20 seconds). Also, the operator may request that certain tracks or radio types not be DFed at all, or that a particular track(s) get priority DF measurements. The update interval, which tracks to DF, and priorities can all be set by the operator through the monitor/workstation 46. When a successful multiple-frequency DF is obtained, it is reported out to the operator (or an external data base).

While the PARINT system 14 is attached to the DF system 12, the PARINT system 14 must give the DF system 12 a DF command when it sees the rising edge of a new pulse that matches (pulse phase, signal strength, and frequency range) on one of the tracks that the tracker/database 44 has determined needs a DF. The signal detector 42 actually sends the DF command. The tracker/database 44 periodically sends to the signal detector 42 the active track parameters (approx. every second) that are used for matching against up alarms in the signal detector 42. The signal detector 42 cleans up this list every second, so that the tracker/database 44 need not delete entries in the signal detector's 42 list of tracks to be DFed. If the tracker/database 44 does not want a track to be DFed anymore, it simply does not send that track's parameters over to the signal detector 42.

When the results from a DF request come back, it is appended to the PDW before being passed on to the tracker/database 44. This means that the PDW that contains the DF information is not in time order with non-DF PDWs. If this pulse gets associated with a track, and the track has been updated with a pulse that was at a later time than the current pulse that has the DF information, then the DF information will be appended to the list of DF data on the track, but the tracking parameters will not be updated using this pulse.

The use of the narrowband DF system 12 inherently limits DFs to pulses that are at least a minimum pulse duration (e.g. 6 milliseconds). This is because the PARINT system 14 must first detect the presence of a pulse, then command the DF system 12 to perform a DF measurement. The latency involved in detecting the pulse, sending the command, starting the DF cycle, and allowing the dual channel receiver 22 to settle its gain means that the pulse may disappear before even one baseline 18 (antenna pair) can be measured. The DF system 12 can preferably be utilized in two ways to catch short duration pulses. First, using manual gain control (MGC) instead of automatic gain control (AGC) in the dual channel receiver 22 will decrease the latency, but, a good knowledge of the right MGC setting vs. the PARINT system 14 observed signal strength is required. Using MGC could drop up to 2 milliseconds off of the DF latency, thus reducing the minimum pulse duration to about 4 milliseconds. The second way is to pretune the dual channel receiver 22 to a frequency that is known to be used by the track that you wish to DF, set the MGC value, and have the DF system 12 continuously collect baselines 18 while waiting for the pulse to show up. While this method will catch fast pulses, it requires a great deal of the DF system's 12 time and takes away the ability for the PARINT system 14 to collect DFs on other transmissions.

It is also important that the PARINT system 14 determine how many different LPI networks are operating, assign active tracks to the network to which they belong, and determine the location of all radios in the network. In order to accomplish this, the PARINT system 14 must exploit elements of the signal that are measurable and common for all the radios in a network. The signal externals that can be exploited are radio type (based on duration and pulse rate), pulse phase, direction, and frequency set used. It may be possible to use signal internals as well (that is, demodulating some pulses to look for bit patterns or bit timing within a pulse). Some of the different radio externals that are predictable and exploited are the pulse phase and the frequency set.

Regarding the pulse phase, when the first radio on a network initially turns on, it sends out a series of synchronization signals so that all receiving radios (with the same code) can synchronize to the transmitter and then predict the pulse pattern. Some radios need only a very short synchronization sequence (a few hundred milliseconds), while others need up to 5 seconds. For most of the LPI radio types, this first synchronization determines the pulse phase for the whole network. Subsequent transmissions from any of the radios on the network will maintain the same pulse phase as long as the time period between transmissions is not too long (a.g. 20 minutes). If it has been too long, then the radio internal clocks of the radios in a network will have drifted from each other, and the network will resynchronize and exhibit a shift in pulse phase. Even if the radios have not exhibited much of a pulse phase shift, there is always some sort of synchronization sequence at the beginning of every transmission, and then periodically during the transmission.

The common pulse phase for the radios on the network allows the PARINT system 14 to associate active tracks to a previously detected network by comparing the track's pulse phase to the best fitted pulse phase from the network. Most radio types that maintain pulse phase for the network between transmissions have a single master station on the network and many slave stations. The master station pulse clock is preformed over the slaves, so that network pulse phase will conform to the master station's clock. Furthermore, master stations are often used to communicate amongst more than one network (by selecting a different code). Hence, both networks will tend to have the same pulse phase. In this case, other external characteristics must be used to differentiate the networks.

Variations in crystal oscillators means the pulse periods of particular radios in the network will be different by a few parts per million, and the accuracy of the PARINT system's 14 estimate of the pulse period for a single radio is limited by the length of time that a single transmission lasted. Hence, there, will always be some phase shift observed between subsequent transmissions on a network, where the amount of shift depends on the time between transmissions, the accuracy of the PARINT system's 14 estimate of the period, and the variation in the crystal oscillators amongst the radios in the network.

Regarding the frequency set, VHF and UHF LPI radios typically use a 25 KHz channel spacing when transmitting on a single pulse. That is, the frequency spectrum is broken up into 25 KHz steps, and a single pulse's frequency is centered in the middle of one of the 25 KHz steps. If the frequency range of the radio covers 58 MHz, then there are a total of 2,320 channels. However, the radio generally uses only a selected subset of these channels. The subset that is selected can be chosen automatically by the network code, or the frequency set can be explicitly programmed into the radios using a fill device. The PARINT system 14 can take advantage of the fact that different networks will almost always have different frequency sets, and use this information to associate a track to a network. The confidence of the association will naturally depend on how thoroughly the frequency set has been determined by the PARINT system 14 for both the track and the network.

In order to determine frequency set, the PARINT system 14 makes a histogram of the pulse frequencies for each track. When it is time to associate a track to a network, this histogram is compared to a similar histogram for the network. Because the PARINT system 14 intercepts only a fraction of the pulses from a radio, it can take some time to build up a full list of all frequencies used. Generally, a single transmission will not be active long enough to build up this list. However, even a partial list can be used to match the track to the network. For example, one common radio type uses only 256 of the possible 2320 frequencies. The probability that two different networks have a significant overlap in the frequency set is small.

The PARINT system 14 also can ban false pulse detections (i.e., pulses not from LPI radios) coming from discrete narrowband frequencies. In order to cut down on the rate of false pulses going to the tracker/database 44, a list of these frequencies is made and given back to the tracker/database 44 so that it does not try to operate on pulses at these frequencies (these frequencies are barred from being used). These frequencies correspond to external signals that have a power near the signal detector's 42 detection thresholds (hence, noise interference causes them to go above and below threshold a lot), and to signals on the fringes of very powerful transmissions.

One method of determining the bar frequency list is to only count those pulses that did not get matched to a track (basically, those pulses that are dropped from the candidate tracker/database 44 because they are too old). The histogram of unmatched pulses is then used to determine the bar list. In order to cut down on the likelihood of barring true LPI radio frequencies (due to misidentifying real pulses from false ones), the number of frequencies barred in any contiguous frequency range can be limited to a fraction of the number of channels used by any radio. For example, do not allow more than 100 channels to be barred.

When the PARINT system 14 interacts with the DF system 12, the DF system 12 will receive a DF request from the PARINT system 14, will perform the DF measurement cycle, and return the results. In addition, the DF system 12 will receive multiple frequency AOA calculation 30 requests, process them, and return the results. It should also be noted that one skilled in the art would recognize that the AOA does not have to be calculated in the DF system 12. The AOA can be calculated by one of the processors that is used by the PARINT system 14. However, the AOA algorithm is logically part of the DF algorithms, and hence is described here as part of the DF system 12, even though it may actually operate on a processor board that is not part of the DF system 12.

There are two modes of operation for the DF system 12 that is attached to the PARINT system 14 in the partial intercept LPI reconnaissance system 10, the tip-off mode and ambush mode. The tip-off mode is where the PARINT system 14 sends a DF command to the DF system 12 when it sees the rising edge of a pulse, and the DF system quickly tunes the dual channel receiver 22 and starts taking a DF cycle. The ambush mode is where the PARINT system 14 commands the DF system 12 to pretune to a frequency that the PARINT system 14 knows is being used by a LPI transmission of interest, and the DF system 12 starts taking DF measurement cycles over and over at that frequency. When a pulse finally does arrive (if it does) at that frequency, then the DF system 12 will already be at that frequency and taking data.

Figure 13:
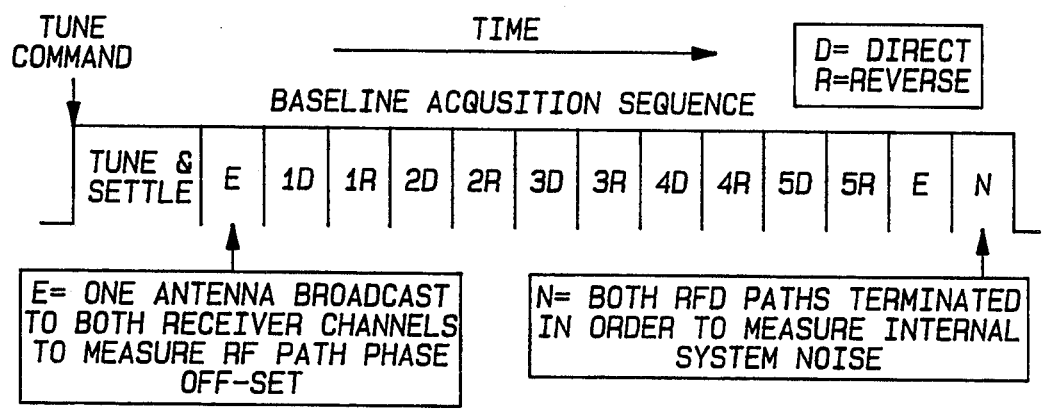
FIG. 13 displays a conventional baseline data acquisition sequence.
Figure 14:
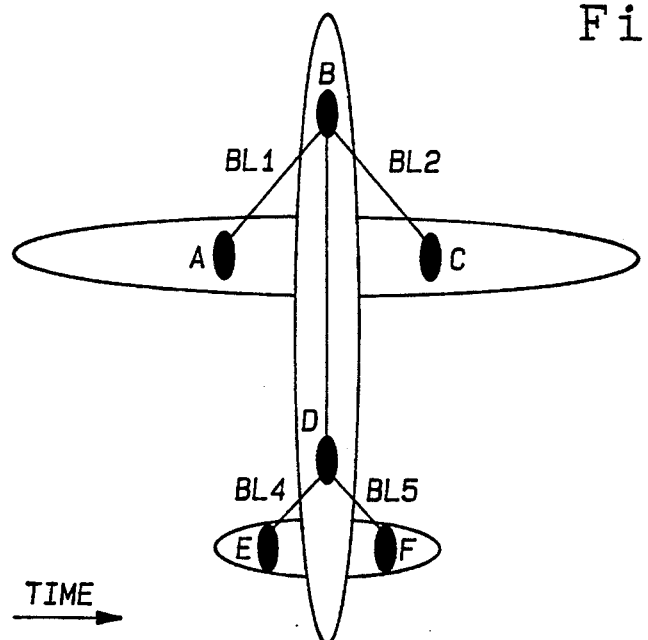
FIG. 14 displays an antenna array affixed to an aircraft.

The partial intercept LPI reconnaissance system 10 acquisition cycle (that is, series of antenna pair phase managements, a.k.a., baseline 18 phase measurements) is nearly identical to that for a conventional coarse DF. An example of a conventional DF cycle is shown in FIG. 13, with the corresponding antenna array shown in FIG. 14. The cycle starts with the tuning and setting of the dual channel receiver 22. While the automatic gain of the receiver 22 is settling, the RF processor 20 is switching through a subset of baselines 18 that ensures that all antennas (that will be used for the DF) are presented to the receiver 22 during the settling period. In this way, the antenna with the strongest signal sets the gain of the receiver 22. A conventional coarse DF measures each baseline 18 twice, for about 1 millisecond on each visit. It measures each baseline 18 once with the first antenna (of the pair) going to receiver channel A and the second antenna going to receiver channel B, and then measures it again with the receiver channels reversed. This reversing of baselines 18 helps to cancel residual phase errors in the RF path. A typical system will have 4 to 7 baselines 18. Each baseline 18 is numbered, and appended with an indication of whether its orientation is the direct (D) orientation of antennas to receiver channels, or if it is the reverse (R). There is also a measurement step called the E baseline. This is where a single antenna is broadcast to both dual channel receiver 22 inputs. This E baseline allows the DF system 12 to measure the phase offset of the two channels in the RF processor 20 and receiver 22, so that the actual baseline 18 phases can be corrected by the offset. In addition, there is noise measurements, where the inputs to the receiver 22 are terminated (no signal), and a measurement taken. This is used to do a crude noise power measurement, so that a signal to noise ratio (SNR) can be calculated.

The partial intercept LPI reconnaissance system 10 acquisition cycle is very similar to the conventional cycle described above, and two examples are shown in FIG. 15. The ordering of the baselines is somewhat different in this cycle. The main difference is that the baselines 18 are reordered every time the cycle is preloaded. This is done because only the first baseline 18 may actually have signal power in any given pulse (before the pulse disappears). In order to get a good AOA, we need data from most of the baselines 18, although we don't necessarily need data from them all. By reordering the baselines 18 every time, the list of baseline 18 data that is stored for a track in the tracker/database 44 is more likely to have a set of measurements that will produce an accurate, unambiguous AOA. The first example in FIG. 15 performs the DF baseline direct and reverse cycles back-to-back. This makes it more likely that both the direct and reverse orientations of the baseline 18 will have signal power, and hence residual phase errors will be better canceled. However, it suffers from the drawback that it takes longer to get a set of different baselines 18 that can be used to calculate a good multiple frequency DF. The second example can get a set of baselines 18 quicker, but suffers from the drawback of generally not getting the extra phase error cancellation obtained by reversing the baselines 18. It relies solely on the E baseline correction to the phase.

Figure 15:
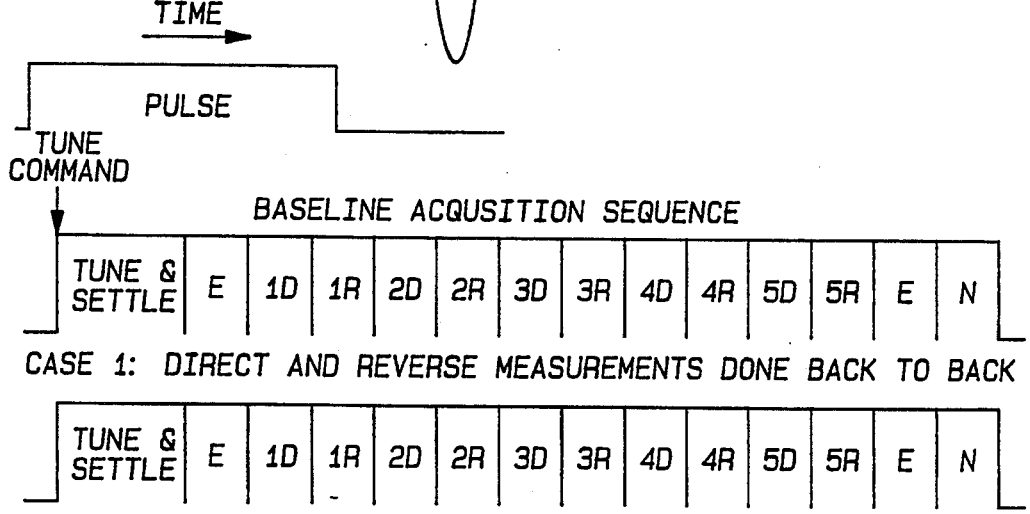
FIG. 15 displays two versions of a PARINT DF cycle of the present invention.

Utilizing the tip-off mode of operation, the PARINT system 14 provides a DF command to the DF system 12 when the PARINT system 14 detects the rising edge of a signal that appears to be matched to an active track that the PARINT system 14 wants to DF. The DF system 12 must tune the dual channel receiver 22 to the signal frequency and take a DF acquisition cycle very quickly. In general, the signal will disappear before the acquisition cycle is complete. The DF system 12 will return the phase data from the baselines 18 that had signal power, even though it is not enough data to completely determine that AOA on the single pulse. FIG. 15, which shows the dual channel DF acquisition cycle for the PARINT system 14, also shows a pulse signal at the top of the figure. Note that the DF tip-off does not occur until well after the signal appears, and the pulse will end before the acquisition cycle is complete.

In order to get a DF measurement on an LPI transmitter, it is necessary for the DF system 12 to get at least one baseline 18 measurement on a pulse before the pulse goes away. Hence, it is necessary to minimize the latency to detect the signal, send and receive the DF command, tune the dual channel receiver 22, settle the receiver 22 gains, and start the baseline 18 switching cycle. If the LPI radio type uses very short pulse duration, such that the DF system 12 will not get at least one good baseline 18 on a pulse, then the PARINT system 14 will not be able to DF that transmission.

It is also necessary that the PARINT system 14 DFs operate in a non-intrusive background mode to conventional DF processing. That is, the PARINT system 14 DFs occur in the time periods where the DF system 12 is not being used by conventional tasking. These unused time periods are only about 100 milliseconds in length, although the typical DF system 12 is generally no more than 50% tasked.

In order to satisfy the above requirements, the DF system 12 software is modified such that no PARINT system 14 DF would be requested when the DF system 12 was busy with conventional requests. Also, when there was no conventional DF processing occurring, the DF system 12 prepares itself to start a PARINT system 14 DF command as fast as possible. This preparation involves premaking all the control processor 28 commands in advance and loading them into the FDF hardware 26, and premaking the dual channel receiver 22 command. Once all this preload is complete, the DF system 12 sends a message to the PARINT system 14 informing it that the DF system 12 is available to do the PARINT system 14 DF commands.

The PARINT system 14 sends the DF command to the DF system 12 through the communication link 54. When the DF system 12 receives a message from the PARINT system 14, the communication link 54 interrupts the control processor 28 in the DF system 12, which handles the actual receipt of the message and the link protocols. In order to start the DF cycle immediately, the communication link 54 interrupt driver immediately checks to see if this is a DF request, and if it is, it starts the preloaded DF cycle immediately. Conventional DF requests are normally started within a DF task (within the operating system of the control processor 28), which received its message from a dispatch task. The conventional DF task would prepare the DF cycle hardware commands, load them into the FDF hardware 26, and pass the results on to the control processor 28. However, the PARINT system 14 cannot afford the time it takes to pass a message to a DF task before starting the cycle. Hence, the preloaded cycle is started immediately in the interrupt driver. However, the interrupt driver does not complete the measurement. Once the measurement cycle is started, it sends a message to the PARINT DF task (known as QCKDF, or quick DF) task, which completes the cycle, reads out the data and passes the data on to the PARINT system 14, prepares for another PARINT system 14 DF request, and then tells the PARINT system 14 that the DF system 12 is available again.

The PARINT system 14 knows to send DF commands only when the DF system 12 is available for PARINT system 14 DFs. This is accomplished by handshaking between the two systems. The DF system 12 sends the PARINT system 14 "available" and "not available" messages. The PARINT system 14 also automatically flags the DF system 12 as "not available" when it sends a DF command, and does not send another DF command until the DF system 12 replies back with an "available" message.

The steps taken by the DF system 12 are summarized below.

a) The DF system 12 checks if there is a waiting conventional DF request. If there is, it processes it and returns to step a). If there is not, it preloads the PARINT system 14 DF measurement cycle, but does not start it. The dual channel receiver 22 is pretuned to the same frequency as the single channel receiver 34 in order to minimize the time that it will take to tune to the actual pulse frequency. (The less difference in old and new frequencies when tuning a receiver, the less time it takes for the synthesizer in the receiver to stabilize.)

b) The DF system 12 sends a message to the PARINT system 14 telling it that the DF system 12 is available for the PARINT system 14 DF commands.

c) The PARINT system 14 detects the rising edge of a pulse that it wants to DF. It sends the specific pulse frequency to the DF system 12 as part of a DF command.

d) The DF system I/O serial interface 48 interrupts the control processor 28 in the DF system 12, which invokes its interrupt driver software.

e) The communication interrupt driver receives the message from the PARINT system 14, checks to see if it is a DF request, and if it is, puts the DF frequency into the premade receiver command and starts the preloaded DF cycle. It then sends a message to the PARINT system 14 DF task, which is blocked on a message receive call to the operating system.

f) The PARINT system 14 DF task is invoked by the operating system and given the DF message. This task waits until the measurement cycle is complete, the control processor 28 retrieves the DF measurement data from the FDF hardware 26. This data consists of the antenna powers and the complex cross-correlation results of the antenna baselines 18.

g) The DF task determines which baseline 18 measurements had signal power, and makes a short list of those measurements. It then uses the complex cross-correlation results to compute the relative phases of the radio wave between the two antennas on each of the baselines 18 that had signal power.

h) The phase information can then be used to calculate a preliminary AOA 30, if desired. The phase information and AOA 30 (if computed) are all sent back to the PARINT system 14 for storage in the tracker/database 44 (if the pulse is associated to one of the tracks).

i) The DF system 12 then returns to step a).

In the ambush mode, the PARINT system 14 determines one of the frequencies of an active track that the PARINT system 14 wants to DF. The PARINT system 14 would then direct the DF system 12 to tune to that frequency and start taking DF measurement cycles repeatedly. When a pulse finally does arrive (if it does) at that frequency, then the DF system 12 will already be at that frequency and taking data, and the latency problem of the tip-off mode of operation can be avoided. It is still necessary for the DF system 12 to determine which set of baseline 18 measurements have signal power and forward that data to the tracker/database 44. As with the tip-off mode, conventional DF requests will take priority, and the ambush mode would be a non-interfering background process to conventional operation.

A multiple-frequency DF algorithm allows the PARINT system 14 to use the DF system 12 and less expensive DF systems to perform direction finding against frequency agile LPI radios. This algorithm is able to piece together accurate, unambiguous AOAs. Hence, the DF system 12 needs only to be good enough to get a partial (as little as a single baseline 18) DF measurement on a pulse, instead of getting a full DF measurement. As a further benefit, the algorithm uses the same DF calibration tables as is used for conventional signals. Hence, no recalibration of the DF system 12 is required.

The following description of the algorithm are in terms of utilizing an interferometer antenna array because it is the preferable type utilized. However, the algorithm also applies to other array types, such as mode forming arrays, as well.

In a conventional single frequency DF measurement cycle, the AOA is determined using calibration tables which relate the RF baseline 18 phase (or array mode output phase and/or amplitude) to AOA. It is possible to determine AOA analytically (without calibration tables) for an ideal antenna array 16 using $$\theta = \cos^{-1}\left(\frac{\lambda \Phi}{2\pi d}\right)$$

where $\theta$ is AOA, $\lambda$ is wavelength, and D is the baseline 18 length. Unfortunately, the antenna array 16 is not ideal, so in order to achieve good DF accuracy, calibration tables are used instead of the analytical calculation.

Antenna array 16 can have all baselines 18 have the same length, or there can be a number of different length baselines 18. Short baselines 18 are able to determine the AOA with no ambiguity other than a mirror ambiguity (it can't tell which side of the baseline the signal is coming from), but short baselines 18 do not give good DF accuracy. Long baselines 18 give good accuracy, but there will generally be a multi-fold ambiguity. That is, since the wavelength of the RF signal can be much shorter than the baseline 18 length, a given phase may correspond to many AOAs. However, in a properly designed antenna array 16, there will be no ambiguities common to all baselines 18.

The AOA is calculated by forming and minimizing an error function ($E_{tot}$) which is a function only of AOA. Each baseline 18 contributes to this error function independently.

$$E_{tot}(\theta) = \sum_{i=1}^{n} E_i(\theta, \phi_i, f_i)$$

In this equation, $\theta$ is AOA, $\phi_i$ is the measured baseline 18 phase, $f_i$ is the baseline 18 frequency, and n is the number of non-identical baseline 18 measurements (i.e. different baselines 18 or same baseline 18 at different frequencies). The AOA is determined by finding the minimum $E_{tot}$, using a minimum search and then quadratic fit to interpolate between calibrated angles. For conventional DF measurements or N channel DF measurements, all of the $f_i$ are equal. However, it is not necessary that they all be equal here in order to minimize the total error function. Not having the same frequency for all baselines 18 can lead to ambiguity problems in some cases, but the minimization software simply needs to recognize such cases so that more data may be taken. This assumes that there is more than one baseline 18, as single baseline 18 measurements, even at multiple frequencies, will always have a mirror ambiguity problem.

A basic problem with the above method is that one cannot be assured that all baselines 18 will have been visited by the radio source at least once by the time you want to do the AOA calculation 30. Even if all baselines 18 have been visited, you are no longer assured of an unambiguous DF result. Note that we have little to no control over which baseline 18 is visited by the LPI radio source because we do not control, nor can predict the time at which the radio source will jump into the frequency range of the dual channel receiver 22 or the intercept single channel receiver 34.

The solution to the ambiguity problem is to simply go ahead and try to do the AOA calculation 30 after a certain number of baseline 18 measurements have been collected, irregardless of whether or not all physical baselines 18 have been visited. (A baseline 18 measurement is a single measurement of a baseline 18 at a given frequency, whereas a physical baseline 18 refers to an actual antenna pair 18. A set of baseline 18 measurements can consist of five measurements of a single physical baseline 18.) The AOA calculation returns a quality of fit value, and this quality value is used to determine if there were enough baseline 18 measurements taken to accurately and unambiguously determine the AOA. If the quality returned is poor, then we simply continue to collect baseline 18 measurements for the LPI radio source, append the new measurements to the old list, and then attempt to recalculate after some number of additional measurements have been collected. This method of solving the ambiguity problem is simple and does not require the development of ad hoc criteria for determining when it is okay to attempt the AOA calculation 30.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined by the following claims.

What is claimed is:

1. A partial intercept LPI (low probability of intercept) reconnaissance system to separately identify, track and provide DF (direction finding) on LPI RF (radio frequency) transmitters, said partial intercept LPI reconnaissance system comprising:

intercepter means for intercepting a plurality of LPI RF signals, said intercepter means operable to down convert the plurality of LPI RF signals to a plurality of LPI IF (intermediate frequency) signals;

digitizer means for down converting the plurality of LPI IF signals to a plurality of LPI baseband signals and for digitizing the plurality of LPI baseband signals to digital data;

spectrum analyzer means for generating a plurality of power spectrums utilizing the digital data;

signal detector means for detecting a plurality of signal clusters in the plurality of power spectrums, wherein said signal detector means associates signal clusters from the same LPI RF signals to create a plurality of pulse descriptor words (PDW) from the plurality of LPI RF signals;

tracker/database means for identifying and tracking the LPI RF transmitters, wherein said tracker/database means identifies the LPI RF transmitters by utilizing pulse duration and pulse frequency of the pulse descriptor words (PDW) and tracks the LPI RF transmitters by utilizing pulse phase; and DF system means for providing DF on the LPI RF transmitters by determining angle of arrival (AOA) of the plurality of LPI RF signals utilizing phase data gathered at different frequencies by a plurality of multiple frequency antenna pair measurements.

2. The partial intercept LPI reconnaissance system as defined in claim 1 wherein the intercepter means includes an antenna and a single channel receiver, said antenna operable to receive the plurality of LPI RF signals, said single channel receiver operable to tune to and down convert the plurality of LPI RF signals to the plurality of LPI IF signals.

3. The partial intercept LPI reconnaissance system as defined in claim 1 wherein the digitizer means includes a mixer and an A/D (analog to digital) converter, said mixer operable to down convert the plurality of LPI IF signals to the plurality of LPI baseband signals, said A/D converter operable to convert the plurality of LPI baseband signals to the digital data.

4. The partial intercept LPI reconnaissance systems as defined in claim 1 wherein the spectrum analyzer means includes an I/O (input/output) module and a spectrum processor, said I/O module operable to control the transfer of the digital data from the digitizer means to the spectrum processor, said spectrum processor operable to process the digital data to generate the plurality of power spectrums.

5. The partial intercept LPI reconnaissance system as defined in claim 4 wherein the I/O module includes a hardware FIFO (first in first out) buffer and a DMA (direct memory access) controller, said FIFO buffer and said DMA controller operable to control the transfer of the digital data from the digitizer means to the spectrum processor.

6. The partial intercept LPI reconnaissance system as defined in claim 5 wherein the spectrum processor includes an input circular buffer and an output circular buffer, said input circular buffer operable to gather and store the digital data in a plurality of data frames, wherein each data frame is utilized for generating each power spectrum, said output circular buffer operable to gather and store the plurality of power spectrums generated by the spectrum processor.

7. The partial intercept LPI reconnaissance system as defined in claim 6 wherein the spectrum processor further includes means for generating a power spectrum by utilizing a portion of the digital data in the data frame, converting this portion of the digital data in the data frame to IEEE (Institute of Electrical and Electronics Engineers) floating point format, applying a window function, performing a fast fourier transform, and computing the magnitude squared.

8. The partial intercept LPI reconnaissance system as defined in claim 7 wherein the spectrum analyzer means is a 6U VME i860 processor card.

9. The partial intercept LPI reconnaissance system as defined in claim 1 wherein the signal detector means computes the average noise power of each power spectrum and associates signal clusters from the same LPI RF signals by utilizing the LPI RF signal frequency, bandwidth, time of arrival (TOA), time of down (TOD) and signal strength.

10. The partial intercept LPI reconnaissance system as defined in claim 9 wherein the signal detector means includes means for determining if any of a plurality of current signal clusters match any of a plurality of previously identified active signal clusters, means for determining if any of a plurality of unassociated signal clusters not matched with the plurality of previously identified active signal clusters are real LPI RF signals or noise and means for determining if any of the plurality of previously identified active signal clusters have gone down to create the plurality of pulse descriptor words for the plurality of LPI RF signals.

11. The partial intercept LPI reconnaissance system as defined in claim 10 wherein the signal detector means is a 6U VME i860 processor card.

12. The partial intercept LPI reconnaissance system as defined in claim 1 wherein the tracker/database means includes means for identifying an LPI RF transmitter by comparing the pulse duration and pulse frequency of the pulse descriptor words (PDW) to a list of known LPI RF transmitter types.

13. The partial intercept LPI reconnaissance system as defined in claim 12 wherein the tracker/database means further includes means for determining if a PDW matches an active transmission of the same LPI RF transmitter in an official database by utilizing the pulse phase of the PDW, wherein if the PDW matches an active transmission, the official database is updated with the PDW.

14. The partial intercept LPI reconnaissance system as defined in claim 13 wherein the tracker/database means further includes means for determining if the PDW matches a candidate transmission in a candidate database by utilizing the pulse phase of the PDW, wherein if the PDW matches a candidate transmission, the candidate database is updated, wherein if the PDW doesn't match a candidate transmission, the PDW is entered into the candidate database as a candidate transmission having only one PDW detected.

15. The partial intercept LPI reconnaissance system as defined in claim 14 wherein the tracker/database means further includes means for determining the precision down time of the PDW to create an updated PDW, if the PDW matches an active transmission in the official database or a maturing candidate transmission in the candidate database by utilizing the digital data in the spectrum analyzer means.

16. The partial intercept LPI reconnaissance system as defined in claim 15 wherein the tracker/database means further includes means for determining if the updated PDW matches an active transmission in the official database or a candidate transmission in the candidate database, wherein if the updated PDW matches an active transmission or a candidate transmission, the official database or the candidate database is updated with the updated PDW, wherein if the updated PDW does not match an active transmission or a candidate transmission, the updated PDW is discarded.

17. The partial intercept LPI reconnaissance system as defined in claim 16 wherein the tracker/database means is a 6U VME i860 processor card.

18. The partial intercept LPI reconnaissance system as defined in claim 1 wherein the pulse phase of a PDW is determined by utilizing a time of down (TOD) of the PDW and an expected TOD that is based on a multiple period extrapolation of measured timing parameter.

19. The partial intercept LPI reconnaissance system as defined in claim 18 wherein the pulse phase of the PDW is determined by taking the difference between the TOD of the PDW and the expected TOD of the PDW.

20. The partial intercept LPI reconnaissance system as defined in claim 1 wherein the DF system means is a narrowband two-channel fast DF system.

21. A partial intercept LPI (low probability of intercept) reconnaissance system to separately identify, track and provide DF (direction finding) on LPI RF (radio frequency) transmitters, said partial intercept LPI reconnaissance system comprising:
  intercepter means for intercepting a plurality of LPI RF signals, said intercepter means operable to down convert the plurality of LPI RF signals to a plurality of LPI IF (intermediate frequency) signals;
  digitizer means for down converting the plurality of LPI IF signals to a plurality of LPI baseband signals and for digitizing the plurality of LPI baseband signals to digital data;
  spectrum analyzer means for generating a plurality of power spectrums utilizing the digital data;
  signal detector means for detecting a plurality of signal clusters in the plurality of power spectrums, wherein said signal detector means associates signal clusters from the same LPI RF signals to create a plurality of pulse descriptor words (PDW) from the plurality of LPI RF signals;
  tracker/database means for identifying and tracking the LPI RF transmitters by utilizing pulse duration, pulse frequency and pulse phase of the pulse descriptor words (PDW); and
  DF system means for providing DF on the LPI RF transmitters by determining angle of arrival (AOA) of the plurality of LPI RF signals utilizing phase data gathered at different frequencies by a plurality of multiple frequency antenna pair measurements.

22. The partial intercept LPI reconnaissance system as defined in claim 21 wherein the DF system means includes an antenna array containing sets of antenna pairs and an RF processor, said antenna array operable to receive the plurality of LPI RF signals, said RF processor operable to switch to each antenna pair in the antenna array.

23. The partial intercept LPI reconnaissance system as defined in claim 22 wherein the DF system means further includes a dual channel receiver, said dual channel receiver operable to tune to and down convert the plurality of LPI RF signals to a plurality of IF signals.

24. The partial intercept LPI reconnaissance system as defined in claim 23 wherein the DF system means further includes a digital processing unit, said digital processing unit including a fast DF hardware and a control processor, said fast DF hardware operable to filter and convert the plurality of IF signals to digital data and operable to integrate the digital data to determine cross correlation data, said control processor operable to convert the cross correlation data into the multiple frequency phase data and operable to provide the DF of the LPI RF transmitters by utilizing the multiple frequency phase data and a calibration table.

25. The partial intercept LPI reconnaissance system as defined in claim 24 wherein the control processor is further operable to transfer the multiple frequency phase data to the tracker/database means for storage and operable to retrieve the multiple frequency phase data accumulated in the tracker/database means to provide the DF of the LPI RF transmitters.

26. The partial intercept LPI reconnaissance system as defined in claim 21 wherein the DF system means provides the DF of an LPI RF transmitter by utilizing the multiple frequency phase data gathered by a plurality of multiple frequency antenna pair measurements.

27. The partial intercept LPI reconnaissance system as defined in claim 26 wherein the DF system means determines the DF of the LPI RF transmitter by forming and minimizing an error function by utilizing the multiple frequency pulse data, the number of antenna pair measurements, and the frequency during each antenna pair measurement.

28. The partial intercept LPI reconnaissance system as defined in claim 21 wherein the signal detector means sends an up alarm to the DF system means to request the DF system means to gather the multiple frequency phase data.

29. The partial intercept LPI reconnaissance system as defined in claim 21 wherein the intercepter means includes an antenna and a single channel receiver, said antenna operable to receive the plurality of LPI RF signals, said single channel receiver operable to tune to and down convert the plurality of LPI RF signals to the plurality of LPI IF signals.

30. The partial intercept LPI reconnaissance system as defined in claim 29 wherein the digitizer means includes a mixer and an A/D (analog to digital) converter, said mixer operable to down convert the plurality of LPI IF signals to the plurality of LPI baseband signals, said A/D converter operable to convert the plurality of LPI baseband signals to the digital data.

31. The partial intercept LPI reconnaissance system as defined in claim 30 wherein the spectrum analyzer means includes a spectrum processor, said spectrum processor operable for generating a power spectrum by utilizing a portion of the digital data in a data frame.

32. The partial intercept LPI reconnaissance system as defined in claim 31 wherein the signal detector means computes the average noise power of each power spectrum and associates signal clusters from the same LPI RF signals by utilizing the LPI RF signal frequency, bandwidth, time of arrival, time of down (TOD) and signal strength.

33. The partial intercept LPI reconnaissance system as defined in claim 32 wherein the tracker/database means determines the pulse phase of a PDW by taking the difference between the TOD of the PDW and the expected TOD of the PDW.

34. A method of separately identifying, tracking and providing DF (direction finding) on LPI (low probability of intercept) RF (radio frequency) transmitters, said method comprising the steps of:
   providing intercepter circuitry for intercepting a plurality of LPI RF signals;
   down converting the plurality of LPI RF signals intercepted by the intercepter circuitry to a plurality of LPI baseband signals and digitizing the plurality of LPI baseband signals to digital data in a digitizer;
   generating a plurality of power spectrums in a spectrum analyzer utilizing the digital data;
   detecting a plurality of signal clusters in the plurality of power spectrums utilizing a signal detector;
   associating signal clusters from the same LPI RF signals to create a plurality of pulse descriptor words (PDW);
   identifying the LPI RF transmitters in a tracker/database by utilizing pulse duration and pulse frequency of the pulse descriptor words;
   tracking the LPI RF transmitters in the tracker/database by utilizing pulse phase of the pulse descriptor words; and
   providing DF on the LPI RF transmitters in a DF system by determining angle of arrival (AOA) of the plurality of LPI RF signals utilizing phase data gathered at multiple frequencies by a plurality of multiple frequency antenna pair measurements and forming and minimizing an error function which is a function of only AOA (angle of arrival) by utilizing the multiple frequency phase data, the number of antenna pair measurements, and the frequency during each antenna pair measurement.

35. The method as defined in claim 34 wherein the step of providing intercepter circuitry includes the steps of providing:
   an antenna to receive the plurality of LPI RF signals; and
   a single channel receiver to tune to and down convert the plurality of LPI RF signals to a plurality of LPI IF signals.

36. The method as defined in claim 35 wherein the step of down converting the plurality of LPI RF signals and digitizing the plurality of LPI basebands signals in a digitizer includes the steps of providing:
   a mixer to down convert the plurality of LPI IF signals to the plurality of LPI baseband signals; and
   an A/D (analog to digital) converter to convert the plurality of LPI baseband signals to the digital data.

37. The method as defined in claim 34 wherein the step of generating the plurality of power spectrums in a spectrum analyzer includes the steps of providing:
   an I/O (input/output) module having a hardware FIFO (first in first out) buffer and a DMA (direct memory access) controller to control the transfer of the digital data from the digitizer to a spectrum processor; and
   the spectrum processor to process the digital data to generate the plurality of power spectrums.

38. The method as defined in claim 37 wherein the step of generating the plurality of power spectrums further includes the steps of:
   storing the digital data in a plurality of data frames;
   utilizing a portion of the digital data in the data frame;
   converting the portion of the digitized data in the data frame to IEEE (*Institute of Electrical and Electronic Engineers*) floating point format;
   applying a window function to the portion of the digital data;
   performing a fast fourier transform to the portion of the digital data; and
   computing the magnitude squared to the portion of the digital data.

39. The method as defined in claim 34 wherein the steps of detecting and associating signal clusters includes the steps of:
   computing the average noise power of each power spectrum;
   determining if any of a plurality of current signal clusters match any of a plurality of previously identified active signal clusters;
   determining if any of a plurality of unassociated signal clusters not matched with the plurality of previously identified active signal clusters are real LPI RF signals or noise; and
   determining if any of the plurality of previously identified active signal clusters have gone down to create the plurality of pulse descriptor words for the plurality of LPI RF signals.

40. The method as defined in claim 34 wherein the step of identifying the RF transmitters includes the step of:
   comparing the pulse duration and pulse frequency of the pulse descriptor words to a list of known LPI RF transmitter types.

41. The method as defined in claim 34 wherein the step of tracking the LPI RF transmitters includes the steps of:
   determining if the PDWs match an active transmission of the same LPI RF transmitter in an official database by utilizing the pulse phase of the PDW;
   updating the official database if the PDW matches an active transmission;
   determining if the PDW matches a candidate transmission in a candidate database by utilizing the pulse phase of the PDW;
   updating the candidate database if the PDW matches a candidate transmission; and
   updating the candidate database if the PDW does not match a candidate transmission as a candidate transmission having only one PDW detected.

42. The method as defined in claim 41 wherein the steps of tracking the RF transmitters further includes the steps of:
   determining the precision down time of the PDW to create an updated PDW if the PDW matches an active transmission in the official database or a maturing candidate transmission in the candidate database;
   determining if the updated PDW matches an active transmission in the official database or a candidate transmission in the candidate database;
   updating the official database or the candidate database with the updated PDW if there is a match; and
   discarding the PDW if there is not a match.

43. The method as defined in claim 34 wherein the step of tracking the LPI RF transmitters includes the steps of:

determining the pulse phase of a PDW utilizing a time of down (TOD) of the PDW and an expected TOD that is based on a multiple period extrapolation of measured timing parameters; and taking the difference between the TOD of the PDW and the expected TOD of the PDW.

* * * * *